(12) United States Patent
Huh et al.

(10) Patent No.: US 11,604,256 B2
(45) Date of Patent: *Mar. 14, 2023

(54) ELECTRONIC DEVICE WITH HEAT-RADIANT STRUCTURE

(71) Applicants: Samsung Electronics Co., Ltd., Suwon-si (KR); Samsung Electro-Mechanics Co., Ltd., Suwon-si (KR)

(72) Inventors: Jaeyoung Huh, Suwon-si (KR); Kyungwan Park, Suwon-si (KR); Jungho Bae, Suwon-si (KR); Boram Kim, Suwon-si (KR); Youngjin Kim, Suwon-si (KR); Hyun Kim, Suwon-si (KR); Byeonghoon Park, Suwon-si (KR); Yoonsun Park, Suwon-si (KR); Woontahk Sung, Suwon-si (KR); Kyungwoo Lee, Suwon-si (KR); Kihoon Jang, Suwon-si (KR); Younho Choi, Suwon-si (KR)

(73) Assignees: Samsung Electronics Co., Ltd., Suwon-si (KR); Samsung Electro-Mechanics Co., Ltd., Suwon-si (KR)

(*) Notice: Subject to any disclaimer, the term of this patent is extended or adjusted under 35 U.S.C. 154(b) by 418 days.

This patent is subject to a terminal disclaimer.

(21) Appl. No.: 16/840,037

(22) Filed: Apr. 3, 2020

(65) Prior Publication Data
US 2020/0319307 A1 Oct. 8, 2020

(30) Foreign Application Priority Data
Apr. 4, 2019 (KR) .................. 10-2019-0039861

(51) Int. Cl.
*G01S 7/481* (2006.01)
*H01S 5/024* (2006.01)
(Continued)

(52) U.S. Cl.
CPC .......... *G01S 7/4813* (2013.01); *G01S 7/4814* (2013.01); *G01S 7/4816* (2013.01); *G01S 17/10* (2013.01);
(Continued)

(58) Field of Classification Search
None
See application file for complete search history.

(56) References Cited

U.S. PATENT DOCUMENTS 5,045,971 A * 9/1991 Ono ........................ H04B 1/034
                                                          361/708
9,391,427 B2 * 7/2016 Eid .......................... H01S 5/023
(Continued)

FOREIGN PATENT DOCUMENTS

CN   207382424 U       5/2018
CN   108934150 A  *  12/2018 ........... H05K 5/0217
(Continued)

OTHER PUBLICATIONS

International Search Report and written opinion dated Jul. 21, 2020 issued in International Application No. PCT/KR2020/004588.

*Primary Examiner* — Reza Aghevli
(74) *Attorney, Agent, or Firm* — Jefferson IP Law, LLP

(57) ABSTRACT

An electronic device including a heat-radiant structure of a camera is provided. The electronic device includes a housing including a front plate, a back plate, an image sensor to receive light through a first region of the back plate, and a laser emitter to emit light through a second region of the back plate, a laser driver, a housing structure surrounding at least a part of a side face of the image sensor and driver, a (Continued)

first metal structure, a first heat transfer member including a first portion, a second portion, and a third portion extended from the second portion to a space between the driver and the front plate, a second heat transfer member extended from the third portion of the first heat transfer member, and a first thermal interface material (TIM) disposed between the second heat transfer member and the front plate.

20 Claims, 23 Drawing Sheets

(51) Int. Cl.
| | | |
|---|---|---|
| *H05K 5/00* | (2006.01) | |
| *H05K 1/02* | (2006.01) | |
| *H05K 1/14* | (2006.01) | |
| *G03B 17/55* | (2021.01) | |
| *H01S 5/02* | (2006.01) | |
| *H05K 7/20* | (2006.01) | |
| *G01S 17/10* | (2020.01) | |
| *H01S 5/023* | (2021.01) | |
| *H01S 5/0233* | (2021.01) | |
| *H01S 5/0235* | (2021.01) | |

(52) U.S. Cl.
CPC ............. *G03B 17/55* (2013.01); *H01S 5/023* (2021.01); *H01S 5/0233* (2021.01); *H01S 5/0235* (2021.01); *H01S 5/02438* (2013.01); *H01S 5/02469* (2013.01); *H01S 5/02476* (2013.01); *H05K 1/0204* (2013.01); *H05K 1/144* (2013.01); *H05K 5/0017* (2013.01); *H05K 7/20336* (2013.01); *H05K 7/20472* (2013.01); *H05K 2201/042* (2013.01); *H05K 2201/10121* (2013.01)

(56) References Cited

U.S. PATENT DOCUMENTS

| | | | |
|---|---|---|---|
| 9,456,201 B2* | 9/2016 | Masalkar | H04N 13/296 |
| 9,591,215 B1* | 3/2017 | Miller | H04N 5/2257 |
| 10,225,954 B2* | 3/2019 | Rasmussen | G06F 1/20 |
| 10,599,019 B2* | 3/2020 | Kim | H04N 5/2257 |
| 10,684,656 B2* | 6/2020 | MacNeil | H04M 1/026 |
| 11,181,955 B2* | 11/2021 | Kwon | G06F 1/1637 |
| 11,388,276 B2* | 7/2022 | Huh | H05K 7/2039 |
| 2006/0263570 A1* | 11/2006 | Bunyan | B32B 15/20 |
| | | | 428/68 |
| 2009/0185354 A1* | 7/2009 | Lee | H05K 7/20472 |
| | | | 361/746 |
| 2010/0053883 A1* | 3/2010 | Ali | G06F 1/203 |
| | | | 361/695 |
| 2015/0160536 A1* | 6/2015 | Lang | H04N 5/2254 |
| | | | 348/374 |
| 2018/0092241 A1* | 3/2018 | Rasmussen | H05K 1/028 |
| 2018/0267390 A1* | 9/2018 | Kim | H04M 1/0264 |
| 2018/0343772 A1* | 11/2018 | Raghupathy | G03B 17/55 |
| 2019/0121404 A1* | 4/2019 | Wu | H05K 7/2029 |
| 2019/0163246 A1* | 5/2019 | Lin | H05K 7/20336 |
| 2021/0185804 A1* | 6/2021 | Huang | H05K 1/0274 |
| 2021/0267088 A1* | 8/2021 | Chien | H05K 7/2049 |

FOREIGN PATENT DOCUMENTS

| | | | | |
|---|---|---|---|---|
| CN | 110859021 A | | 3/2020 | |
| CN | 113747750 A | * | 12/2021 | ........... H05K 7/2017 |
| CN | 216218450 U | * | 4/2022 | |
| DE | 202006010517 U1 | * | 11/2006 | ............... G06F 1/20 |
| EP | 3925561 A1 | * | 12/2021 | ......... A45D 26/0061 |
| JP | 11087955 A | * | 3/1999 | ............... H05K 7/20 |
| KR | 101417695 B1 | | 7/2014 | |
| KR | 10-2018-0094831 A | | 8/2018 | |
| KR | 10-2018-0126849 A | | 11/2018 | |
| WO | 2012024578 A2 | | 2/2012 | |

* cited by examiner

ELECTRONIC DEVICE WITH HEAT-RADIANT STRUCTURE

CROSS-REFERENCE TO RELATED APPLICATION(S)

This application is based on and claims priority under 35 U.S.C. § 119 of a Korean patent application number 10-2019-0039861, filed on Apr. 4, 2019, in the Korean Intellectual Property Office, the disclosure of which is herein incorporated by reference in its entirety.

JOINT RESEARCH AGREEMENT

The disclosure was made by or on behalf of the below listed parties to a joint research agreement. The joint research agreement was in effect on or before the date the disclosure was made and the disclosure was made as a result of activities undertaken within the scope of the joint research agreement. The parties to the joint research agreement are 1) Samsung Electronics Co., Ltd., and 2) Samsung Electro-Mechanics Co., Ltd.

BACKGROUND

1. Field

The disclosure relates to an electronic device. More particularly, the disclosure relates to a heat dissipation structure of a camera mounted on an electronic device.

2. Description of Related Art

An electronic device may have at least one Time of Flight (ToF) camera mounted thereon to measure a distance by using an optical operation of a light receiver and light emitter. The ToF camera may be mounted inside a housing in a stacked manner to reduce a mounting dimension. As a current consuming source of the ToF camera, heating sources, i.e., a light emitter (e.g., Vertical Cavity Surface Emitting Laser (VCSEL)) and a driver (e.g., a driver IC) may be mounted on a printed circuit board in a stacked manner.

However, the heating sources, i.e., the light emitter and the driver, disposed in a stacked manner may be vulnerable to heating.

When the electronic device includes a 5G communication antenna, if the 5G communication antenna is disposed around a ToF camera and thus operates as a heating source, it may be difficult to meet a surface heating standard without a separate heat dissipation structure.

For example, when the 5G communication antenna and the driver simultaneously produce heat, current consumption may be increased, and thus it may be difficult to control such heating.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device which secures a heat dissipation structure of a Time of Flight (ToF) camera.

Another aspect of the disclosure is to provide an electronic device which secures a heat dissipation structure of a ToF camera, in the electronic device including a 5G communication antenna.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a front plate facing a first direction and a back plate facing a second direction opposite to the first direction, an image sensor to receive light through a first region of the back plate, the image sensor disposed inside the housing, a laser emitter to emit light through a second region of the back plate, adjacent to the first region, the laser emitter disposed inside the housing, adjacent to the image sensor, a laser driver disposed between the laser emitter and the front plate, a housing structure surrounding at least a part of a side face of the image sensor and driver, a first metal structure disposed between the laser emitter and the laser driver, a first heat transfer member, including a first portion disposed between the first metal structure and the driver, a second portion extended from the first portion along an outer face of the housing structure, and a third portion extended from the second portion to a space between the driver and the front plate, while in contact with the first metal structure, a second heat transfer member extended from the third portion of the first heat transfer member, and a first Thermal Interface Material (TIM) disposed between the second heat transfer member and the front plate, the first TIM being in contact with the second heat transfer member.

In accordance with another aspect of the disclosure, an electronic device is provided. The electronic device includes a housing including a front plate facing a first direction and a back plate facing a second direction opposite to the first direction, a first printed circuit board including a first face facing the first direction and a second face facing the second direction, the first printed circuit board being disposed inside the housing, a second printed circuit board including a third face facing the first direction and a fourth face facing the second direction, and disposed to be spaced apart in the first direction from the first printed circuit board, an image sensor to receive light through a first region of the back plate, the image sensor disposed at the fourth face, a laser emitter to emit light through a second region of the back plate, the laser emitter disposed at the second face, a laser driver adjacent to the image sensor and disposed at the fourth face, a housing structure surrounding at least part of a side face of the image sensor and laser driver, a first heat transfer member including a first portion thermally coupled with the first printed circuit board and disposed between the first printed circuit board and the driver, a second portion extended along an outer face of the housing structure from the first portion, and a third portion extended from the second portion to a space between the second printed circuit board and the back plate, and a first Thermal Interface Material (TIM) thermally coupled with a part of the first heat transfer member and disposed between a third portion of the first heat transfer member and the front plate.

Various embodiments of the disclosure can dissipate heat produced in a Time of Flight (ToF) camera.

According to various embodiments of the disclosure, heat produced in a ToF camera can be dissipated in an electronic device having a 5G communication antenna mounted thereon.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
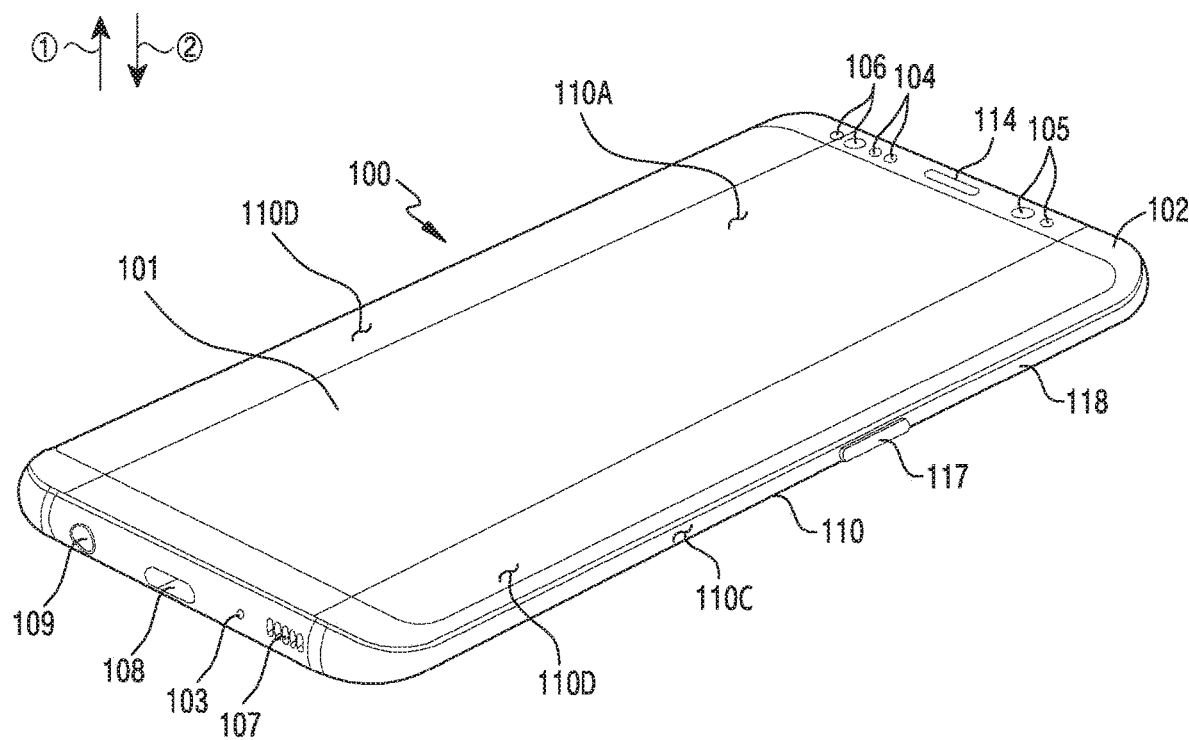
FIG. 1 is a perspective view illustrating a front face of an electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements.

An electronic device according to various embodiments of the disclosure may include at least one of, for example, a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device (e.g., smart glasses, a Head-Mounted Display (HMD), electronic clothes, an electronic bracelet, an electronic necklace, an electronic appcessory, an electronic tattoo, a smart mirror, or a smart watch).

Figure 2:
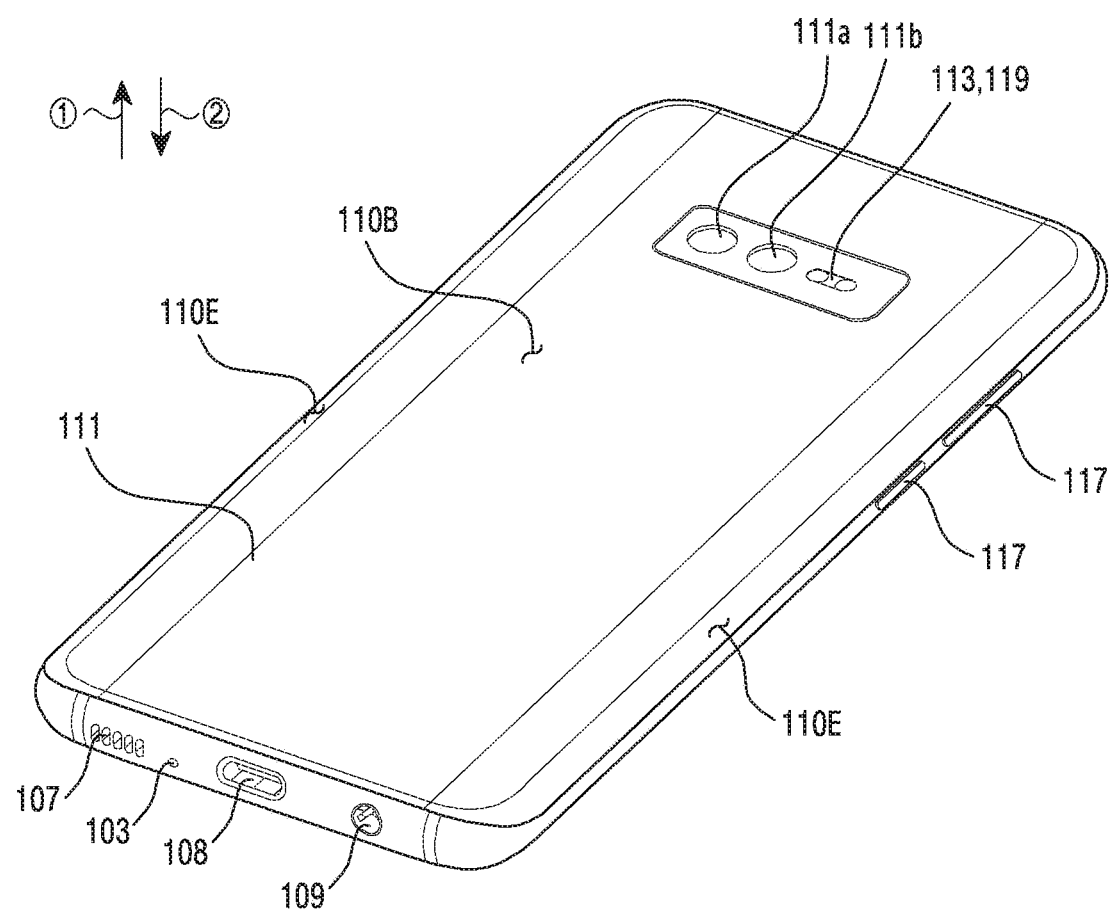
FIG. 2 is a perspective view illustrating a back face of the electronic device of FIG. 1 according to an embodiment of the disclosure.

FIG. 1 is a perspective view illustrating a front face of a mobile electronic device according to an embodiment of the disclosure. FIG. 2 is a perspective view illustrating a rear face of the electronic device of FIG. 1 according to an embodiment of the disclosure.

Referring to FIGS. 1 and 2, an electronic device 100 according to various embodiments may include a housing 110 including a first face (or a front face) 110A, a second face (or a rear face) 110B, and a lateral face 110C surrounding a space between the first face 100A and the second face 110B. In another embodiment (not shown), the housing may refer to a structure which constitutes part of the first face 110A, second face 110B, and third face 110C of FIG. 1. According to an embodiment, the first face 110A may be constructed of a front plate 102 (e.g., a polymer plate or a glass plate having various coating layers) which is at least partially transparent in practice. The second face 110B may be constructed of a rear plate 111 which is opaque in practice. For example, the rear plate 111 may be constructed of coated or colored glass, ceramic, polymer, metallic materials (e.g. aluminum, stainless steel (STS), or magnesium) or a combination of at least two of these materials. The lateral face 110C may be constructed of a lateral bezel structure (or a lateral member) 118 bonded to the front plate 102 and the rear plate 111 and including metal and/or polymer. In some embodiments, the rear plate 111 and the lateral bezel structure 118 may be constructed integrally and may include the same material (e.g., a metallic material such as aluminum).

In the illustrated embodiment, the front plate 102 may include two first regions 110D seamlessly extended by being bent from the first face 110A toward the rear plate 111 at both ends of a long edge of the front plate 102. In the illustrated embodiment (see FIG. 2), the rear plate 111 may include two second regions 110E seamlessly extended by being bent from the second face 110B toward the front plate 102 at both ends of a long edge. In some embodiments, the front plate 102 (or the rear plate 111) may include only one of the first regions 110D (or the second regions 110E). In another embodiment, some of the first regions 110D or the second regions 110E may not be included. In the above embodiments, in a lateral view of the electronic device 100, the lateral bezel structure 118 may have a first thickness (or width) at a lateral face in which the first regions 110D or the second regions 110E are not included, and may have a second thickness thinner than the first thickness at a lateral face in which the first regions 110E or the second regions 110E are included.

According to an embodiment, the electronic device 100 may include at least one or more of a display 101, audio modules 103, 107, and 114, sensor modules 104, 116, and 119, camera modules 105, 112, and 113, a key input device 117, a light emitting element 106, and connector holes 108 and 109. In some embodiments, the electronic device 100 may omit at least one of components (e.g., the key input device 117 or the light emitting element 106), or other components may be additionally included.

The display 101 may be exposed through, for example, some portions of the front plate 102. In some embodiments, at least part of the display 101 may be exposed through the first face 110A and the front plate 102 constructing the first regions 110E of the lateral face 110C. In some embodiments, a corner of the display 101 may be constructed to be substantially the same as an outer boundary adjacent to the front plate 102. In another embodiment (not shown), in order to expand an area in which the display 101 is exposed, the display 110 and the front plate 102 may be constructed to have substantially the same interval between outer boundaries thereof.

In another embodiment (not shown), a portion of a screen display region of the display 101 may have a recess or opening, and may include at least one or more of the audio module 114, sensor module 104, camera module 105, and light emitting element 106 which are aligned with the recess or the opening may be included. In another embodiment (not shown), at least one of the audio module 114, the sensor module 104, the camera module 105, the fingerprint sensor 116, and the light emitting element 106 may be included in a rear face of the screen display region of the display 101. In another embodiment (not shown), the display 101 may be disposed adjacent to or joined with a touch sensing circuit, a pressure sensor capable of measuring touch strength (pressure), and/or a digitizer for detecting a magnetic-type stylus pen. In some embodiments, at least part of the sensor modules 104 and 119 and/or at least part of the key input device 117 may be disposed to the first regions 110D and/or the second regions 110E.

The audio modules 103, 107, and 114 may include the microphone hole 103 and the speaker holes 107 and 114. The microphone hole 103 may have a microphone disposed inside thereof to acquire external sound, and in some embodiments, may have a plurality of microphones disposed to sense a sound direction. The speaker holes 107 and 114 may include the external speaker hole 107 and the communication receiver hole 114. In some embodiments, the speaker holes 107 and 114 and the microphone hole 103 may be implemented with one hole, or the speaker may be included without the speaker holes 107 and 114 (e.g., a Piezo speaker).

The sensor modules 104, 116, and 119 may generate an electrical signal or data value corresponding to an internal operational state of the electronic device 100 or an external environmental state. The sensor modules 104, 116, and 119 may include, for example, the first sensor module 104 (e.g., a proximity sensor) and/or second sensor module (not shown) (e.g., a fingerprint sensor) disposed to the first face 110A of the housing 110, and/or the third sensor module 119 (e.g., a Heart Rate Monitoring (HRM) sensor) disposed to the second face 110B of the housing 110 and/or the fourth sensor module 116 (e.g., a fingerprint sensor). The fingerprint sensor may be disposed not only to the first face 110A (e.g., the display 101) but also the second face 110B of the housing 110. The electronic device 100 may further include at least one of sensor modules (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illuminance sensor.

The camera modules 105, 112, and 113 may include the first camera device 105 disposed to the first face 110A of the electronic device 100, the second camera device 112 disposed to the second face 110B, and/or the flash 113. The camera module 105 and 112 may include one or more lenses, an image sensor, and/or an image signal processor. The flash 113 may include, for example, a Light Emitting Diode (LED) or a xenon lamp. In some embodiments, two or more lenses (wide angle and telephoto lenses) and image sensors may be disposed to one face of the electronic device 100.

The key input device 117 may be disposed to the lateral face 110C of the housing 110. In another embodiment, the electronic device 100 may not include the entirety or part of the aforementioned key input device 117. The key input device 117, which is not included, may be implemented on a display 101 in a different form such as a soft key or the like. In some embodiments, the key input device may include the sensor module 116 disposed to the second face 110B of the housing 110.

The light emitting element 106 may be disposed, for example, to the first face 110A of the housing 110. The light emitting element 106 may provide, for example, state information of the electronic device 100 in an optical form. In another embodiment, the light emitting element 106 may provide, for example, a light source interworking with an operation of the camera module 105. The light emitting element 106 may include, for example, an LED, an IR LED, and a xenon lamp.

The connector holes 108 and 109 may include the first connector hole 108 capable of housing a connector (e.g., a USB connector) for transmitting/receiving power and/or data of an external electronic device and/or the second connector hole (e.g., earphone jack) 109 capable of housing a connector for transmitting/receiving an audio signal with respect to the external electronic device.

Figure 3:
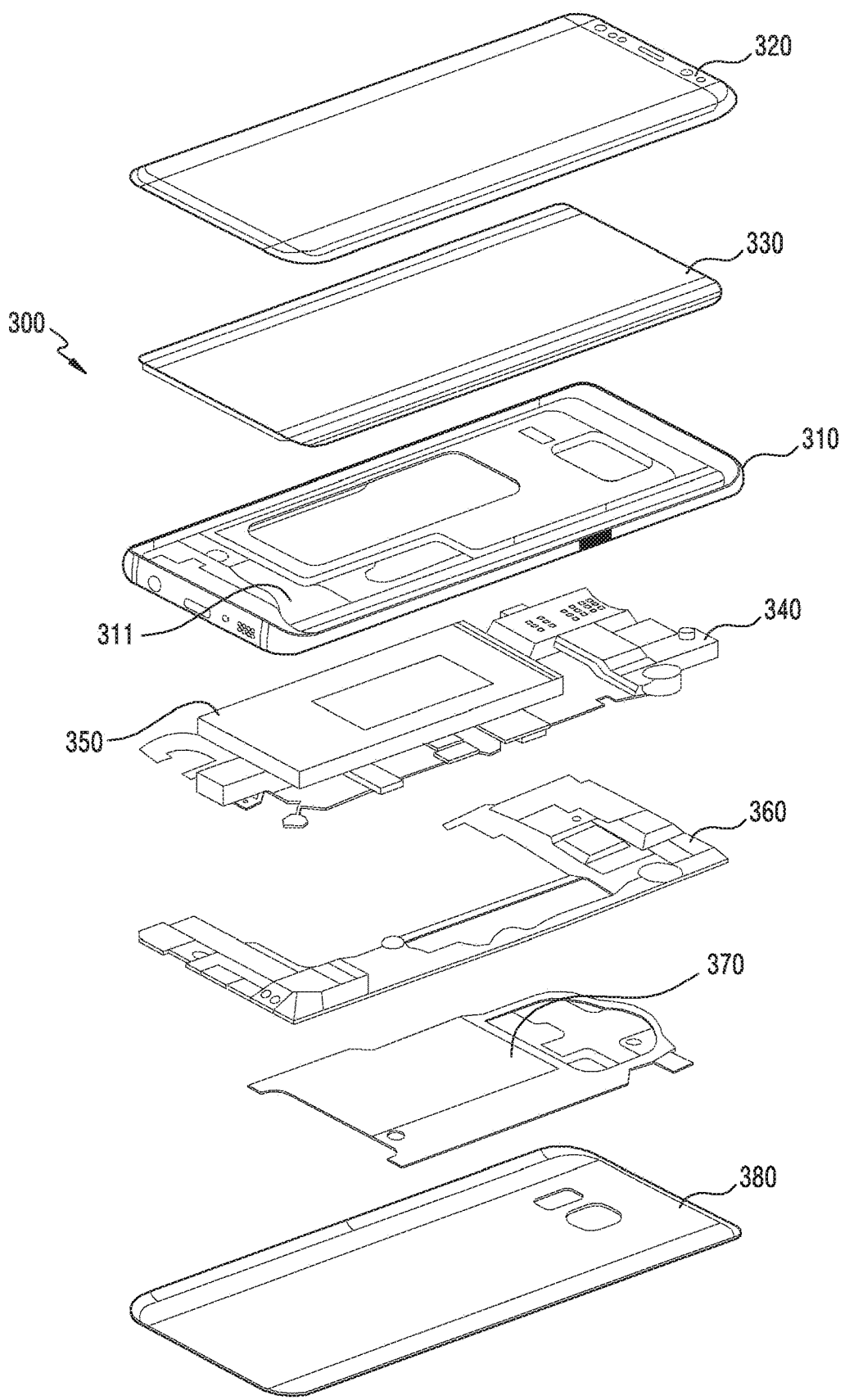
FIG. 3 is an exploded perspective view of the electronic device of FIG. 1 according to an embodiment of the disclosure.

FIG. 3 is an exploded perspective view illustrating an inner structure of the electronic device of FIG. 1 according to an embodiment of the disclosure.

Referring to FIG. 3, an electronic device 300 may include a lateral bezel structure 310, a first support member 311 (e.g., a bracket), a front plate 320, a display 330, a Printed Circuit Board (PCB) 340, a battery 350, a second support member 360 (e.g., a rear case), an antenna 370, and a rear plate 380. In some embodiments, the electronic device 300 may omit at least one (e.g., the first support member 311) of these components, or may additionally include other components. At least one of the components of the electronic device 300 may be the same as or similar to at least one of the components of the electronic device 100 of FIG. 1 or FIG. 2, and redundant descriptions will be omitted hereinafter.

The first support member 311 may be coupled with the lateral bezel structure 310 by being disposed inside the electronic device 300, or may be constructed integrally with respect to the lateral bezel structure 310. The first support member 311 may be constructed of, for example, a metal material and/or non-metal material (e.g., polymer). The display 330 may be coupled to one side of the first support member 311, and the PCB 340 may be coupled to the other side thereof. A processor, a memory, and/or an interface may be mounted on the PCB 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a High Definition Multimedia Interface (HDMI), a Universal Serial Bus (USB) interface, a Secure Digital (SD) card interface, and/or an audio interface. For example, the interface may electrically or physically couple the electronic device 300 and the external electronic device, and may include a USB connector, an SD card/MMC connector, or an audio connector.

As a device for supplying power to at least one component of the electronic device 300, the battery 350 may include, for example, a non-rechargeable primary cell, a rechargeable secondary cell, or a fuel cell. At least one portion of the battery 350 may be disposed on the same plane substantially with respect to, for example, the PCB 340. The battery 350 may be disposed integrally inside the electronic device 300, or may be detachably disposed with respect to the electronic device 300.

The antenna 370 may be disposed between the rear plate 380 and the battery 350. The antenna 370 may include, for example, a Near Field Communication (NFC) antenna, a wireless charging antenna, and/or a Magnetic Secure Transmission (MST) antenna. The antenna 370 may perform NFC, for example, with the external electronic device, or may wirelessly transmit/receive power required for charging. In another embodiment, an antenna structure may be constructed by at least part of the lateral bezel structure 310 and/or the first support member 311 or a combination thereof.

Figure 4A:
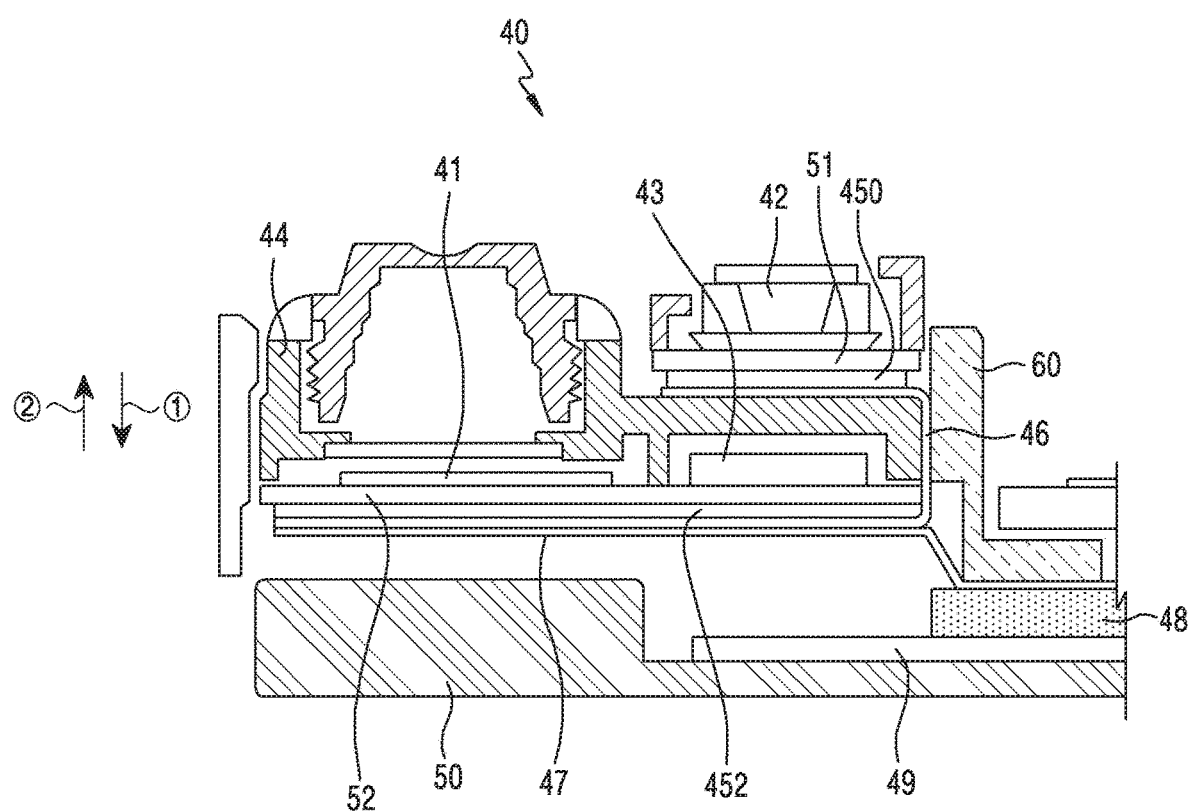
FIG. 4A is a cross-sectional view illustrating a heat dissipation structure of a camera mounted on an electronic device according to an embodiment of the disclosure.
Figure 4B:
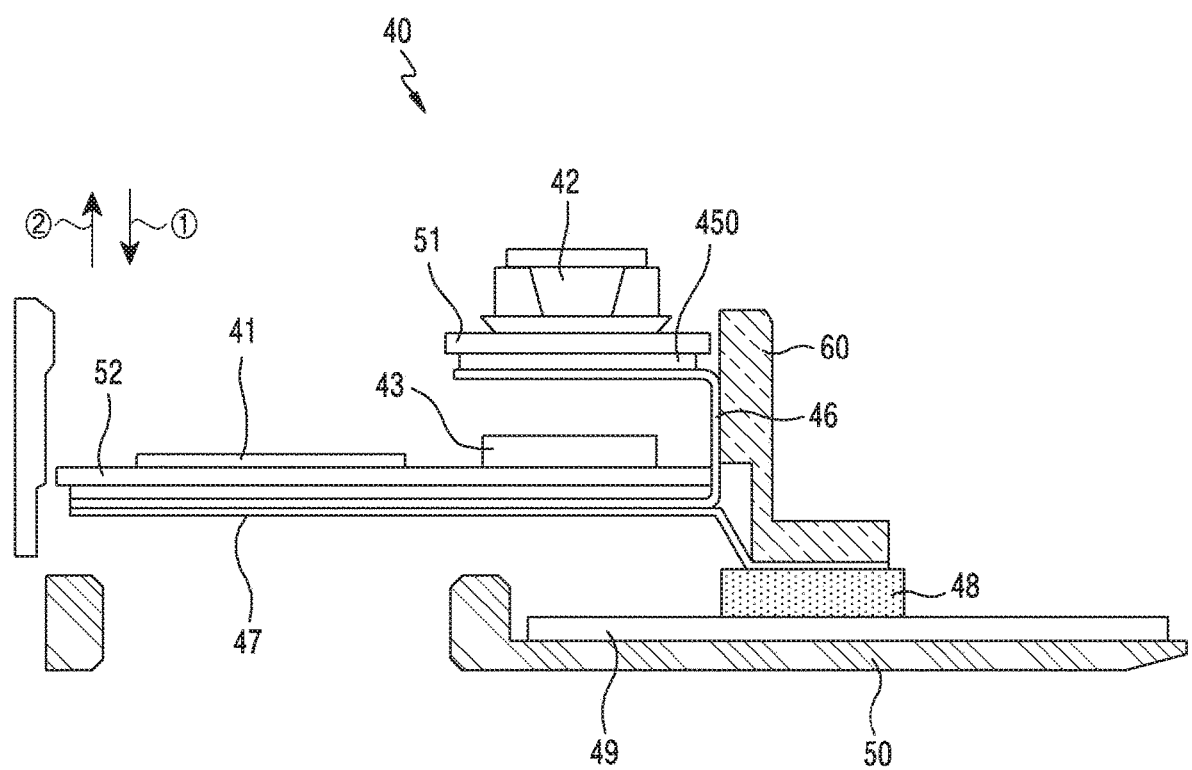
FIG. 4B illustrates a state in which a housing structure is removed from the heat dissipation structure of the camera of FIG. 4A according to an embodiment of the disclosure.
Figure 4C:
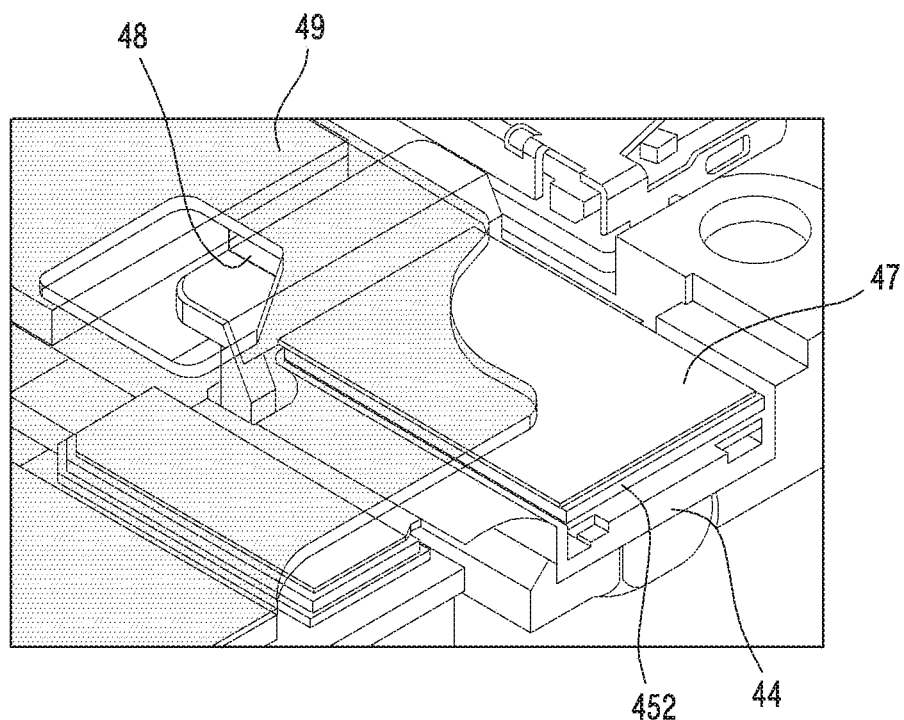
FIG. 4C is a perspective view illustrating part of the heat dissipation structure of the camera of FIG. 4A in an enlarged scale according to an embodiment of the disclosure.
Figure 4D:
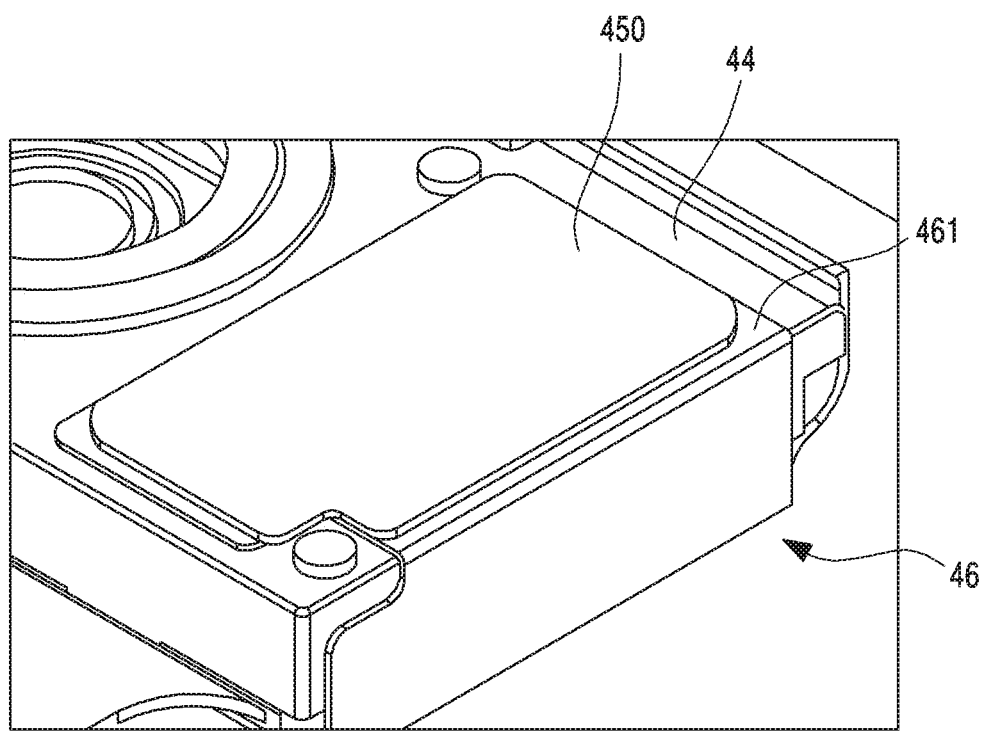
FIG. 4D is a perspective view illustrating a state of disposing a first heat transfer member of the heat dissipation structure of the camera of FIG. 4A in an enlarged scale according to an embodiment of the disclosure.

FIG. 4A is a cross-sectional view illustrating a heat dissipation structure of a camera mounted on an electronic device according to an embodiment of the disclosure. FIG. 4B illustrates a state in which a housing structure is removed from the heat dissipation structure of the camera of FIG. 4A according to an embodiment of the disclosure. FIG. 4C is a perspective view illustrating part of the heat dissipation structure of the camera of FIG. 4A in an enlarged scale according to an embodiment of the disclosure. FIG. 4D is a perspective view illustrating a state of disposing a first heat transfer member of the heat dissipation structure of the camera of FIG. 4A in an enlarged scale according to an embodiment of the disclosure.

Referring to FIGS. 4A to 4D, an electronic device according to various embodiments of the disclosure (e.g., the electronic device 100 of FIG. 1 or the electronic device 300 of FIG. 3) may include at least one camera (e.g., the camera 105 of FIG. 1 or the camera 113 of FIG. 2) disposed inside a housing (e.g., the housing 110 of FIG. 1). According to an embodiment, the camera may be disposed to be optically operable through at least part of a front plate (e.g., the front plate 102 of FIG. 1) of the housing, or may be disposed to be optically operable through at least part of a back plate (e.g., the back or rear plate 111 of FIG. 2) of the housing. A first direction ① (e.g., the first direction ① of FIG. 1) may be a direction toward a display (e.g., the display 101 of FIG. 1), and a second direction ② (e.g., the second direction ② of FIG. 1) may be a direction toward a back plate (e.g., the back plate 111 of FIG. 2).

Hereinafter, a camera will be described with reference to an embodiment of a structure in which an optical operation is performed through at least part of a back plate of a housing. For example, the camera may include a Time of Flight (ToF) camera. Hereinafter, the ToF camera will be referred to as the camera.

According to an embodiment, a camera 40 may include a housing structure 44. In addition, according to an embodiment, the camera 40 may include an image sensor 41, a laser emitter 42, a laser driver 43, first and second printed circuit boards 51 and 52, or a heat dissipation structure. According to an embodiment, the housing structure 44 may include the image sensor 41, the laser driver 43, the first and second printed circuit boards 51 and 52, and the laser emitter 42. For example, the housing structure 44 may be composed of a polymer material or a metal material or a combination of the polymer and metal materials.

According to an embodiment, the image sensor 41 may be disposed inside the housing (e.g., the housing 110 of FIG. 1), and may be mounted on the second printed circuit board 52. According to an embodiment, the laser driver 43 may be disposed between the laser emitter 42 and a front plate (e.g., the front plate 102 of FIG. 1), and may overlap at least in part with the laser emitter 42.

According to an embodiment, the laser emitter 42 may be disposed on the housing structure 44, and may be disposed on the layer driver 43 in a stacked manner.

According to an embodiment, in the heat dissipation structure, heat of the laser emitter 42 or laser driver 43 may be transferred to a portion, e.g., a vapor chamber 49 or a bracket 50, having a relatively low temperature.

According to an embodiment, the housing structure 44 may include at least one image sensor 41 disposed to receive light through a second region (e.g., the second region 111*b* of FIG. 2) of the back plate, and the laser emitter 42 disposed to emit light through a first region (e.g., the first region 111*a* of FIG. 2) of the back plate. According to an embodiment, the housing structure 44 may be constructed in a shape of surrounding at least part of a side face of the image sensor 41 and the laser driver 43.

According to an embodiment, the laser emitter 42 may be disposed adjacent to the image sensor 41, and the second region (e.g., the second region 111*b* of FIG. 2) may be disposed adjacent to the first region (e.g., the first region 111*a* of FIG. 2). For example, the laser emitter 42 may include a Vertical Cavity Surface Emitting Laser (VCSEL), and the laser driver 43 may include a drive IC.

According to an embodiment, the heat dissipation structure may be a structure of spreading or transferring heat produced from a heating element (e.g., the laser emitter 42, the laser driver 43, or the first and second printed circuit boards 51 and 52) to a portion having a relatively low temperature.

According to an embodiment, the heat dissipation structure may include a first heat transfer member 46. According to an embodiment, the first heat transfer member 46 may transfer heat produced in the laser emitter 42 toward the vaper chamber 49. For example, the first heat transfer member 46 may include a graphite sheet or a shape in which the graphite sheet and a cupper sheet are laminated. According to an embodiment, the first heat transfer member 46 may be bent at least one time to transfer heat produced from the laser emitter 42 toward the vapor chamber 49 via a side face of the housing structure 44.

According to an embodiment, the heat dissipation structure may include a first TIM 48 capable of transferring heat transferred to the first heat transfer member 46, toward the vapor chamber 49. According to an embodiment, the first TIM 48 may be disposed between a portion of the first heat transfer member 46 and the vapor chamber 49. According to an embodiment, the first TIM 48 may be thermally disposed to the first heat transfer member 46 and the vapor chamber 49.

According to an embodiment, the vapor chamber 49 may be thermally coupled with a bracket 50 (e.g., a display bracket). According to an embodiment, the vapor chamber 49 may be constructed of an upper base of a copper material and a lower base, and may be disposed in a plate shape. For example, the vapor chamber 49 may be replaced with a heat pipe.

According to an embodiment, each of the first and second printed circuit boards 51 and 52 may be spaced apart from each other, may be made of a flexible material, and may be electrically coupled by using a multi-layered flexible board. According to an embodiment, the first and second printed circuit boards 51 and 52 may be provided with rigidity respectively by first and second metal structures 450 and 452. A reference numeral 60 may indicate a support member (e.g., the support member 310 of FIG. 3).

Figure 5:
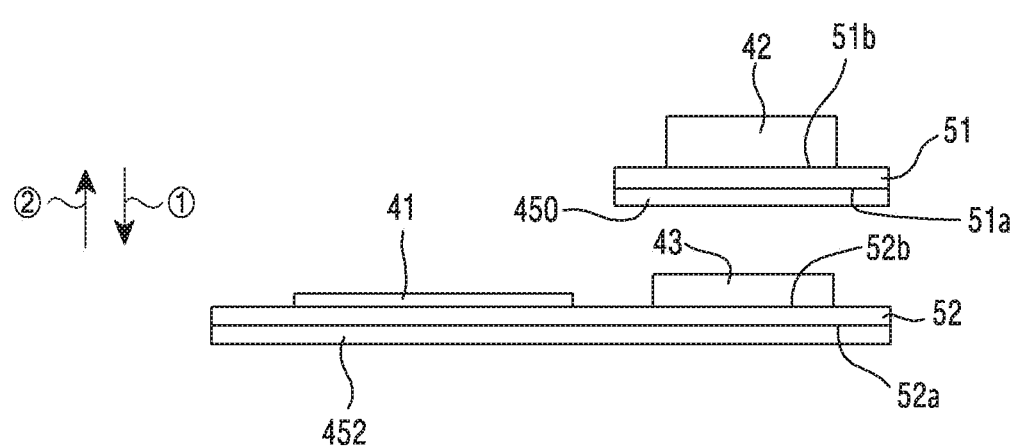
FIG. 5 briefly illustrates a state of disposing an image sensor, a laser emitter, and a laser driver according to an embodiment of the disclosure.

FIG. 5 briefly illustrates a state of disposing an image sensor, a laser emitter, and a laser driver according to an embodiment of the disclosure.

Referring to FIG. 5, the first printed circuit board 51 according to an embodiment may be disposed between the laser emitter 42 and the first metal structure 450. According to an embodiment, the second printed circuit board 52 may be disposed between the laser driver 43 and the first heat transfer member 46. The first printed circuit board 51 may be electrically coupled with the second printed circuit board 52. For example, a flexible circuit board may be used in electrical coupling of the first and second printed circuit boards 51 and 52. According to an embodiment, the first printed circuit board 51 may include a first face 51*a* facing a first direction ① and a second face 51*b* facing a second direction ② opposite to the first direction ①. According to an embodiment, the laser emitter 42 may be mounted on the second face 51*b* of the first printed circuit board 51. According to an embodiment, the second printed circuit board 52 may include a third face 52*a* facing the first direction ① and a fourth face 52*b* facing the second direction ② opposite to the first direction ①. According to an embodiment, the image sensor 41 and the laser driver 43 may be mounted on the fourth face 52*b* of the second printed circuit board 52.

According to an embodiment, the first printed circuit board 51 may include a flexible material. According to an embodiment, the first printed circuit board 51 may have the first metal structure 450, e.g., a first metal plate, attached to the first face 51*a*. According to an embodiment, the first metal structure 450 may serve for a stiffener function of supporting the first printed circuit board 51 and a function of a member which transfers heat produced in the first printed circuit board 51. According to an embodiment, the first metal structure may be composed of clad metal (SUS+AL or SUS+Cu) or a high-strength copper alloy material to secure heat transfer characteristics while securing at least a specific level of rigidity.

According to an embodiment, the second printed circuit board 52 may include a flexible material. According to an embodiment, the second printed circuit board 52 may have the second metal structure 452, e.g., a second metal plate, attached to the fourth 52*b*. According to an embodiment, the second metal structure 452 may be composed of a copper alloy material, and may serve for a stiffener function of supporting the second printed circuit board 52 and a function of a member which transfers heat produced in the second printed circuit board 52. According to an embodiment, the first metal structure 450 may be disposed to overlap at least in part with the second metal structure 452.

Figure 6:
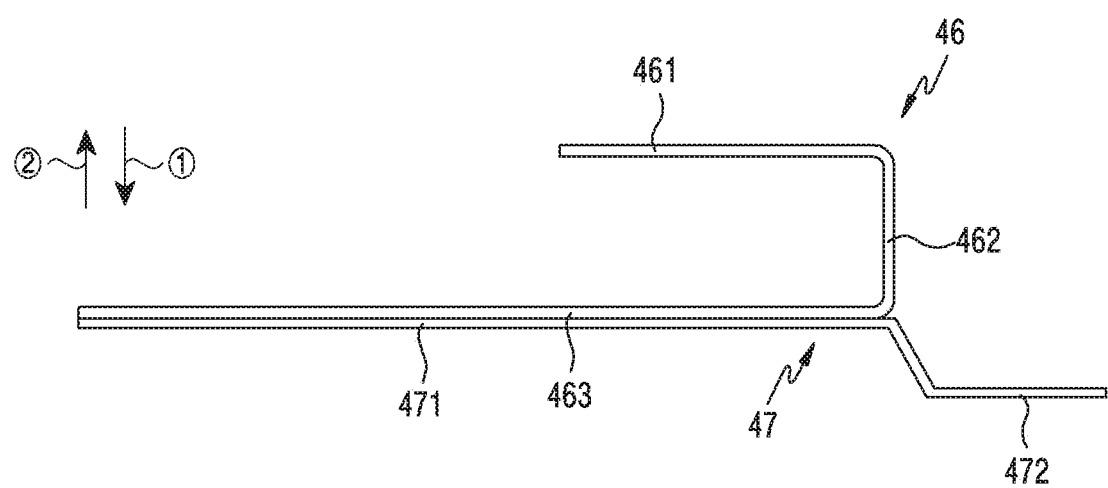
FIG. 6 is a side view illustrating a structure of a first heat transfer member and second heat transfer member according to an embodiment of the disclosure.

FIG. 6 is a side view illustrating a structure of a first heat transfer member and second heat transfer member according to an embodiment of the disclosure.

Referring to FIG. 6, the first heat transfer member 46 according to an embodiment may be disposed in a state of being bent at least one time. According to an embodiment, the first heat transfer member 46 may include a first portion 461 disposed between the first metal structure 450 and a driver (e.g., the laser driver 43 of FIG. 5) while being in contact with the first metal structure (e.g., the first metal structure 450 of FIG. 5). According to an embodiment, the first heat transfer member 46 may include a second portion 462 extended along an outer face of a housing structure (e.g., the housing structure 44 of FIG. 4A) form the first portion 461. According to an embodiment, the first heat transfer member 46 may include a third portion 463 extended between the laser driver 43 and a back plate (e.g., the back plate 111 of FIG. 2) from the second portion 462. According to an embodiment, the second portion 462 may be bent approximately about 90 degrees in a first direction ① from the first portion 461, and the third portion 463 may be bent approximately about 90 degrees in a vertical direction with respect to the first direction ① from the second portion 462.

According to an embodiment, the first portion 461 may be disposed between a first metal structure (e.g., the first metal structure 450 of FIG. 5) and a laser driver (e.g., the laser driver 43 of FIG. 5). According to an embodiment, the second portion 462 may be disposed between a side face of the housing structure 44 and a support member (e.g., the support member 310 of FIG. 3). According to an embodiment, the third portion 463 may be disposed between a second metal structure (e.g., the second metal structure 452 of FIG. 5) and a first TIM (e.g., the first TIM 48 of FIG. 4A).

According to an embodiment, the first heat transfer member 46 may further include a second heat transfer member 47. According to an embodiment, the second heat transfer member 47 may thermally couple the first heat transfer member 46 to the first TIM (e.g., the first TIM 48 of FIG. 4A). According to an embodiment, the second heat transfer member 47 may include a first portion 471 attached to the first heat transfer member 46 and a second portion 472 disposed between the bracket 50 and the first TIM 48 while being bent from the first portion 471. For example, the first portion 471 or the second portion 472 may be disposed at least in part. For example, each of the first heat transfer member 46 and the second heat transfer member 47 may include a graphite sheet.

Figure 7A:
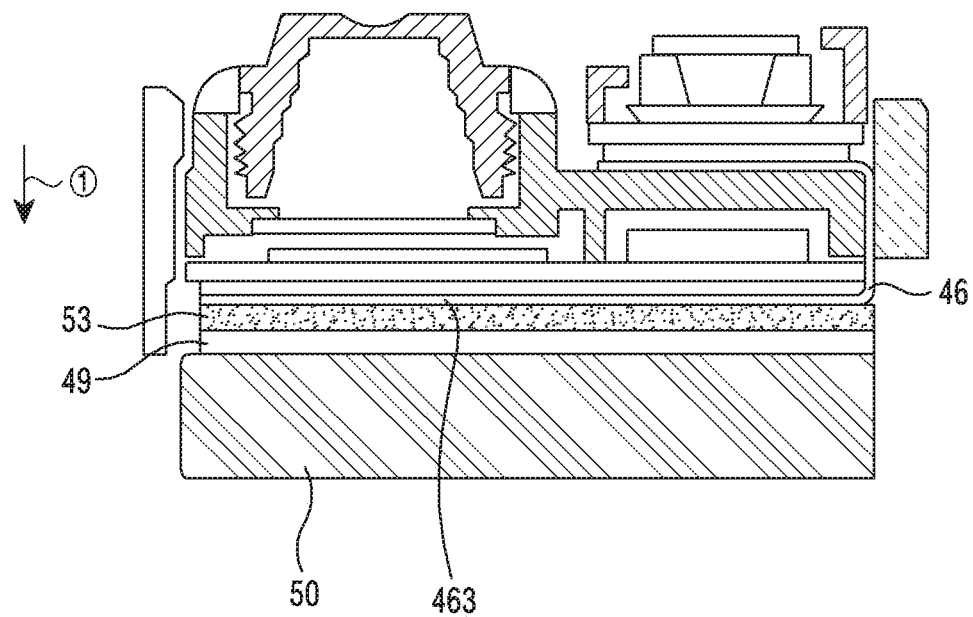
FIG. 7A is a cross-sectional view illustrating a heat dissipation structure of a camera mounted on an electronic device according to an embodiment of the disclosure.
Figure 7B:
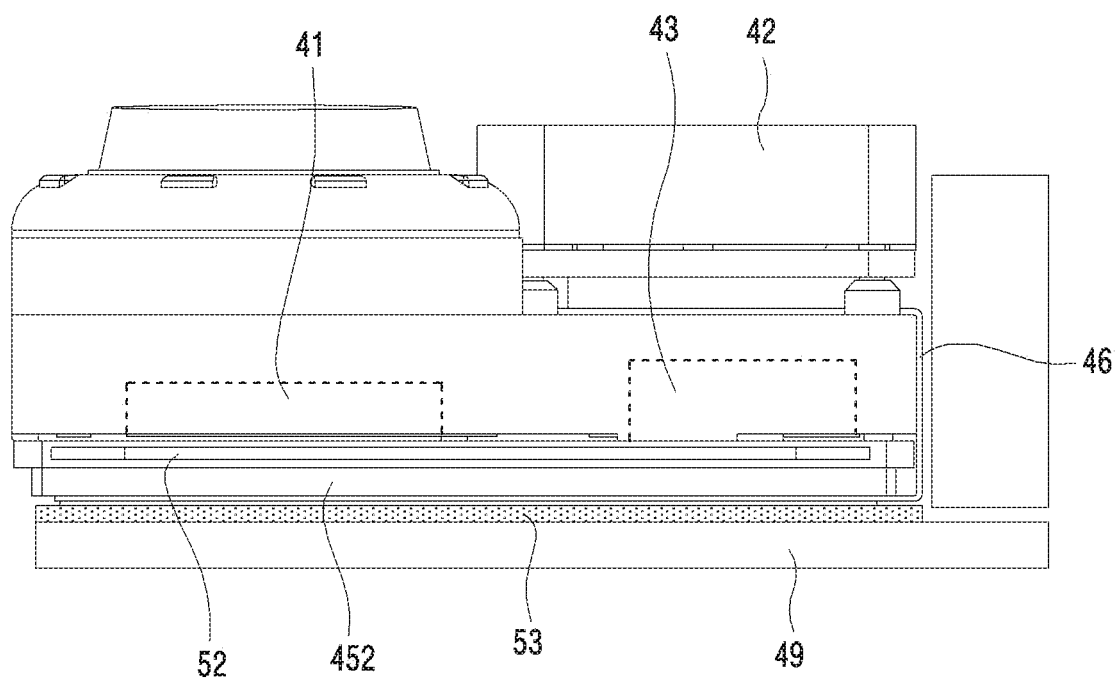
FIG. 7B is a side view illustrating a heat dissipation structure of a camera mounted on an electronic device according to an embodiment of the disclosure.

FIG. 7A is a cross-sectional view illustrating a heat dissipation structure of a camera mounted on an electronic device according to an embodiment of the disclosure. FIG. 7B is a side view illustrating a heat dissipation structure of a camera mounted on an electronic device according to an embodiment of the disclosure.

The heat dissipation structure of FIG. 7A and FIG. 7B will be described in comparison with the heat dissipation structure of the camera of FIG. 4A, and only different parts will be described while omitting descriptions on the same structure. The heat dissipation structure of the camera according to an embodiment is the same as the heat dissipation structure of FIG. 4A except for the structures of the first heat transfer member 46 and first TIM 53, and thus detailed descriptions thereof will be omitted.

According to an embodiment, the first TIM 53 may be disposed between the third portion 463 of the first heat transfer member and a back plate (e.g., the back plate 111 of FIG. 2). According to an embodiment, the first TIM 53 may be attached to the third portion 463 and may be disposed in a first direction of the third portion 463. According to an embodiment, at least part of the first TIM 53 may be closely in contact with the vapor chamber 49, and at least part of the vapor chamber 49 may be closely in contact with at least part of the bracket 50. According to an embodiment, the first TIM 53 may be thermally coupled with each of the third portion 463 and the vapor chamber 49. According to an embodiment, the vapor chamber 49 may be thermally coupled with the bracket 50 (e.g., a display bracket).

Figure 8A:
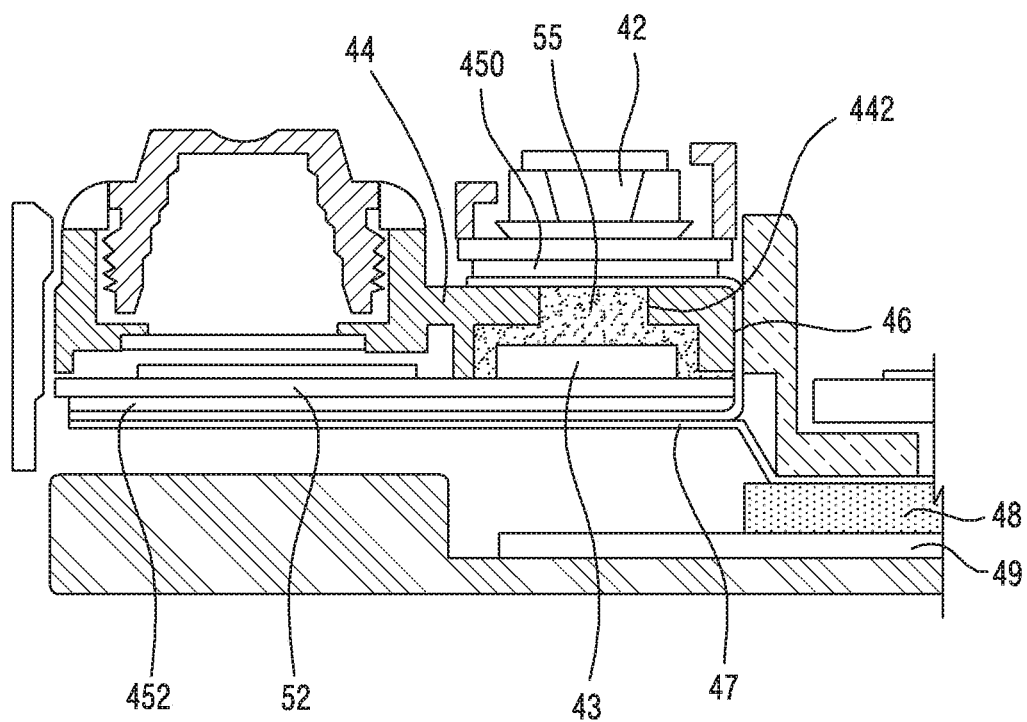
FIG. 8A is a cross-sectional view illustrating a heat dissipation structure of a camera mounted on an electronic device according to an embodiment of the disclosure.
Figure 8B:
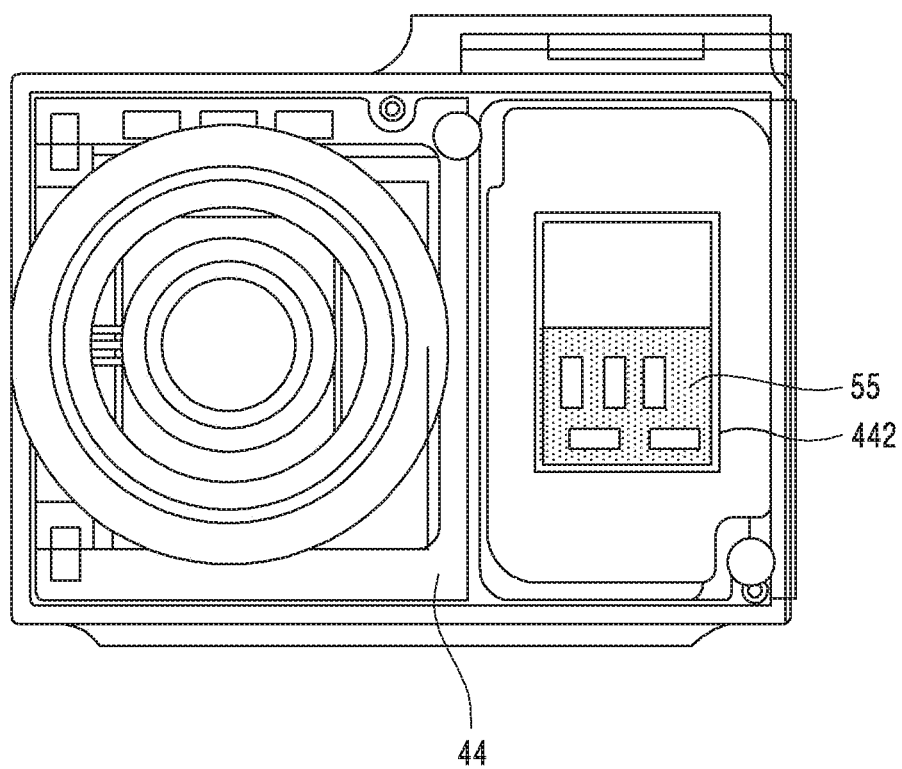
FIG. 8B is a plan view illustrating a filling opening of a housing structure according to an embodiment of the disclosure.
Figure 8C:
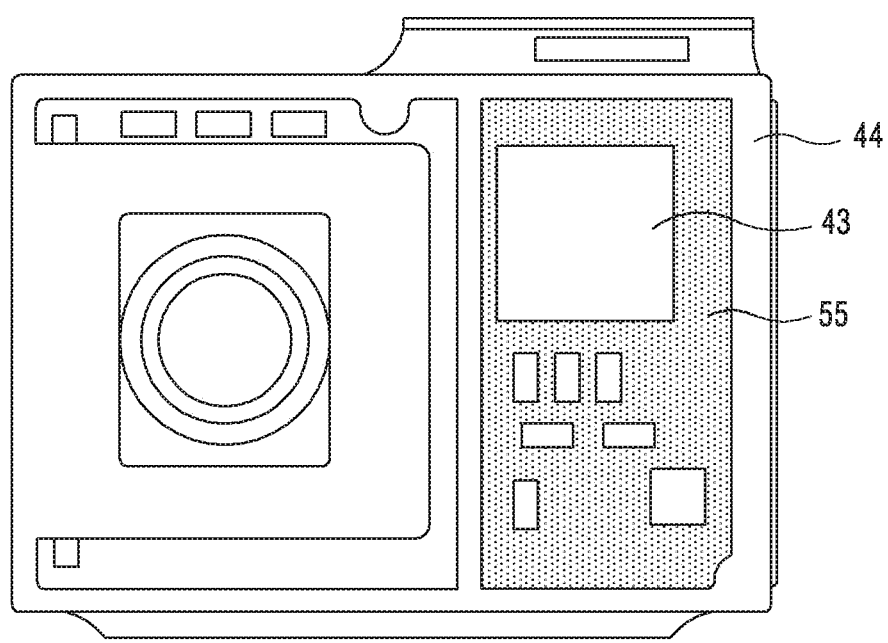
FIG. 8C is a plan view illustrating a position of a laser driver and a region filled with a Thermal Interface Material (TIM) according to an embodiment of the disclosure.

FIG. 8A is a cross-sectional view illustrating a heat dissipation structure of a camera mounted on an electronic device according to an embodiment of the disclosure. FIG. 8B is a plan view illustrating a filling opening of a housing structure according to an embodiment of the disclosure. FIG. 8C is a plan view illustrating a position of a laser driver and a region filled with a TIM according to an embodiment of the disclosure.

The heat dissipation structure of FIG. 8A and FIG. 8B will be described in comparison with the heat dissipation structure of the camera of FIG. 4A, and only different parts will be described while omitting descriptions on the same structure. The heat dissipation structure of the camera according to an embodiment is the same as the heat dissipation structure of FIG. 4A except for the structure of transferring heat from the laser emitter 42 to the vapor chamber 49, and thus detailed descriptions thereof will be omitted.

According to an embodiment, a TIM 55 may fill an inner space of the housing structure 44 in which the laser driver 43 is housed. According to an embodiment, when the TIM 55 of a liquid state fills a space between the housing structure 44 and the laser driver 43, the filling TIM 55 may act as a heat transfer member. According to an embodiment, in the filling TIM 55, at least a first portion may be closely in contact with the first metal structure 450, and at least a second portion may surround the laser driver 43 and be closely in contact with the second printed circuit board 52. According to an embodiment, heat produced in the laser emitter 42 may be transferred toward the second metal structure 452 via the laser driver 43 by means of the first metal structure 450 and the filling TIM 55, i.e., a heat transfer filler. The transferred heat may be spread to the vapor chamber 49 via the first heat transfer member 46, the second heat transfer member 47, and the first TIM 48.

According to an embodiment, the housing structure 44 may have at least one filling opening 442 so as to be filled with the TIM 55 of a liquid state. For example, the opening 442 may be constructed in various shapes.

Figure 9:
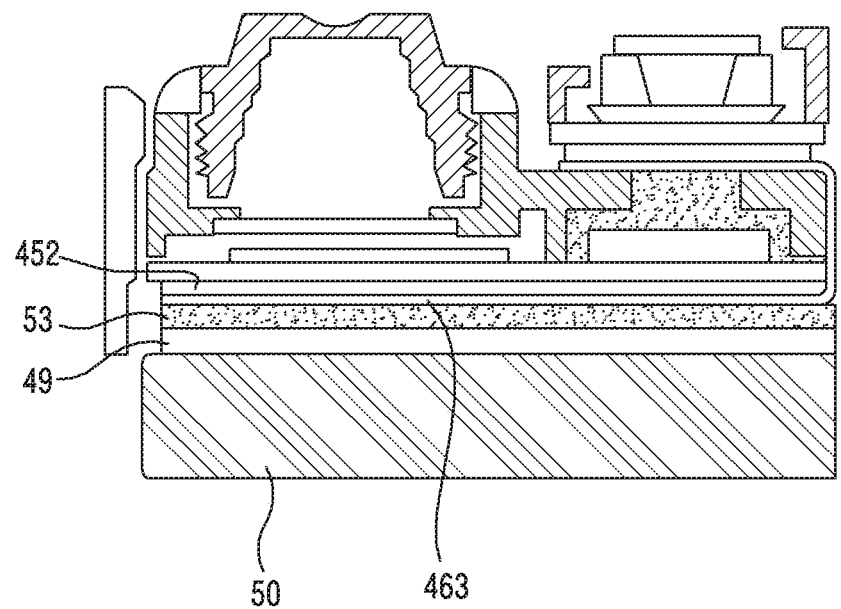
FIG. 9 is a cross-sectional view illustrating a heat dissipation structure of a camera according to an embodiment of the disclosure.
Figure 10:
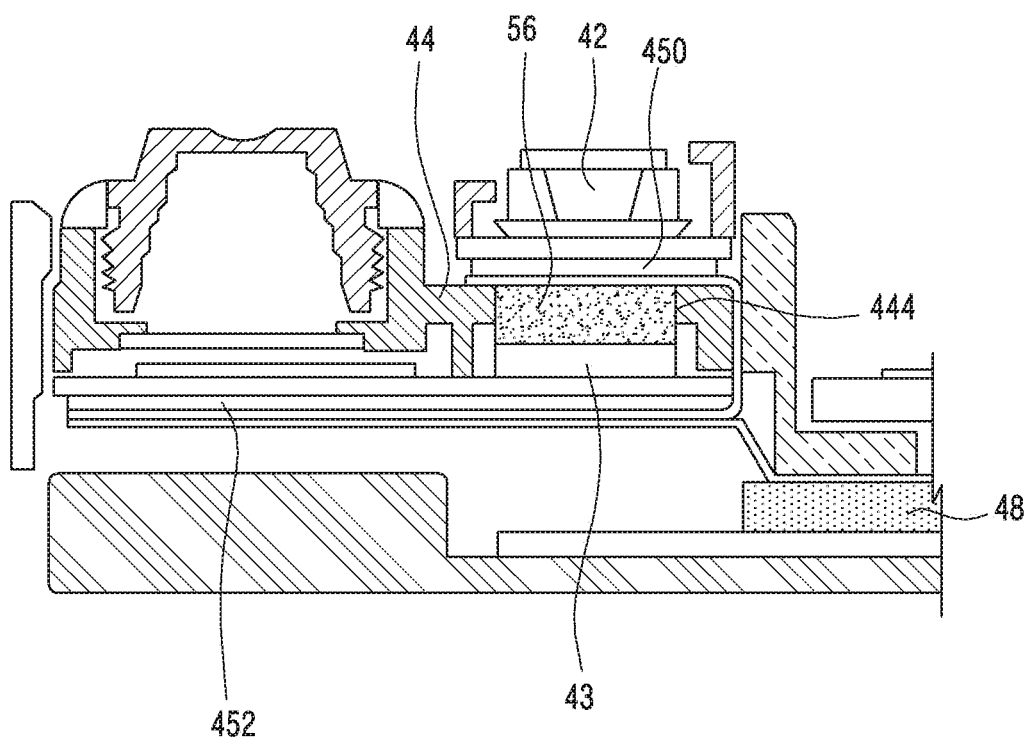
FIG. 10 is a cross-sectional view illustrating a heat dissipation structure of a camera according to an embodiment of the disclosure.
Figure 11:
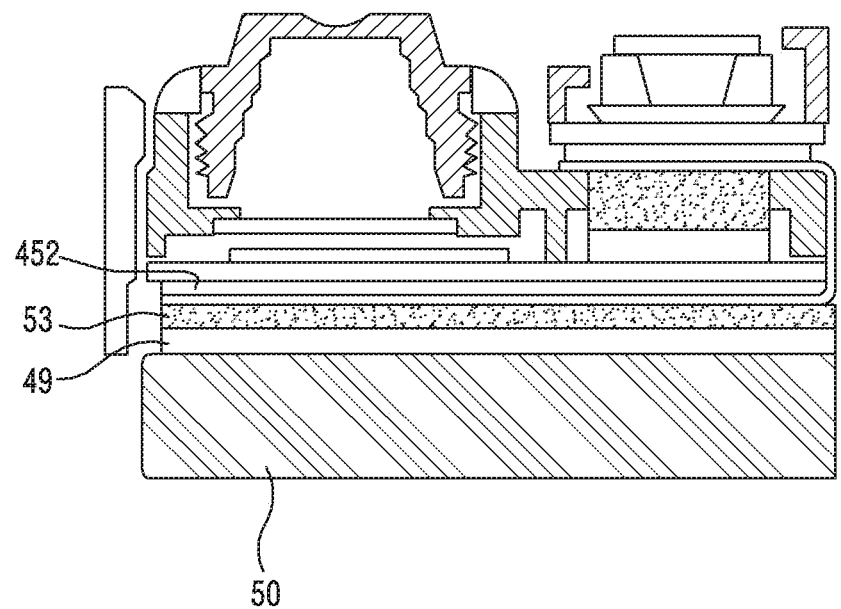
FIG. 11 is a cross-sectional view illustrating a heat dissipation structure of a camera according to an embodiment of the disclosure.

FIG. 9 to FIG. 11 are cross-sectional views illustrating a heat dissipation structure of a camera according to various other embodiments of the disclosure.

Referring to FIG. 9, the heat dissipation structure will be described in comparison with the heat dissipation structure of the camera of FIG. 9, and only different parts will be described while omitting descriptions on the same structure. The heat dissipation structure of the camera according to an embodiment is the same as the heat dissipation structure of FIG. 8 except for the structure of transferring heat from the second metal structure 452 to the vapor chamber, and thus detailed descriptions thereof will be omitted.

According to an embodiment, the TIM 53 may be disposed to one face of the second metal structure 452. According to an embodiment, the TIM 53 may be disposed in a layered manner so that heat transferred from the second metal structure 452 is spread to the vapor chamber 49. According to an embodiment, heat transferred to the vapor chamber 49 may be transferred to the bracket 50, e.g., a display bracket.

According to an embodiment, the second metal structure 452 may be thermally coupled with the TIM 53, and may be thermally coupled with the vapor chamber 49. According to an embodiment, the TIM 53 may be thermally coupled with the vapor chamber 49. According to an embodiment, the vapor chamber 49 may be thermally coupled with the bracket 50. According to an embodiment, the second metal structure 452 may be thermally coupled with the bracket 50.

Referring to FIG. 10, the heat dissipation structure will be described in comparison with the heat dissipation structure of the camera of FIG. 4A, and only different parts will be described while omitting descriptions on the same structure. The heat dissipation structure of the camera according to an embodiment is the same as the heat dissipation structure of FIG. 4A except for the structure of transferring heat from the laser emitter 42 to the vapor chamber, and thus detailed descriptions thereof will be omitted.

According to an embodiment, the housing structure 44 may have an inner space between an outer face and the laser driver 43. According to an embodiment, when the TIM 56 is attached between the housing structure 44 and the laser driver 43, the attached TIM 56 may act as a heat transfer member. According to an embodiment, in the attached TIM 56, at least a first portion may be thermally coupled closely in contact with the first metal structure 450, and at least a second portion may be thermally coupled closely in contact with the laser driver 43. Heat produced in the laser emitter 42 may be transferred toward the second metal structure 452 by means of the attached TIM 56 by passing the laser driver 43 by means of the TIM 56 attached to the first metal structure 450. The transferred heat may be spread to the vapor chamber 48 via the second metal structure 452 and the first TIM 48.

According to an embodiment, the housing structure 44 may have at least one attaching opening 444 to attach the TIM 56. For example, the attaching opening may be constructed in various shapes.

Referring to FIG. 11, the heat dissipation structure will be described in comparison with the heat dissipation structure of the camera of FIG. 10, and only different parts will be described while omitting descriptions on the same structure. The heat dissipation structure of the camera according to an embodiment is the same as the heat dissipation structure of FIG. 10 except for the structure of transferring heat from the second metal structure 452 to the vapor chamber 49, and thus detailed descriptions thereof will be omitted.

According to an embodiment, the TIM 53 may be disposed to one face of the second metal structure 452. According to an embodiment, the TIM 53 may be disposed so that heat transferred from the second metal structure 452 is spread to the vapor chamber 49. According to an embodiment, heat transferred to the vapor chamber 49 may be transferred to the bracket 50, e.g., a display bracket.

According to an embodiment, the second metal structure 452 may be thermally coupled with the TIM 53, and may be thermally coupled with the vapor chamber 49. According to an embodiment, the TIM 53 may be thermally coupled with the vaper chamber 49. According to an embodiment, the vaper chamber 49 may be thermally coupled with the bracket 50. According to an embodiment, the second metal structure 452 may be thermally coupled with the bracket 50.

Figure 12A:
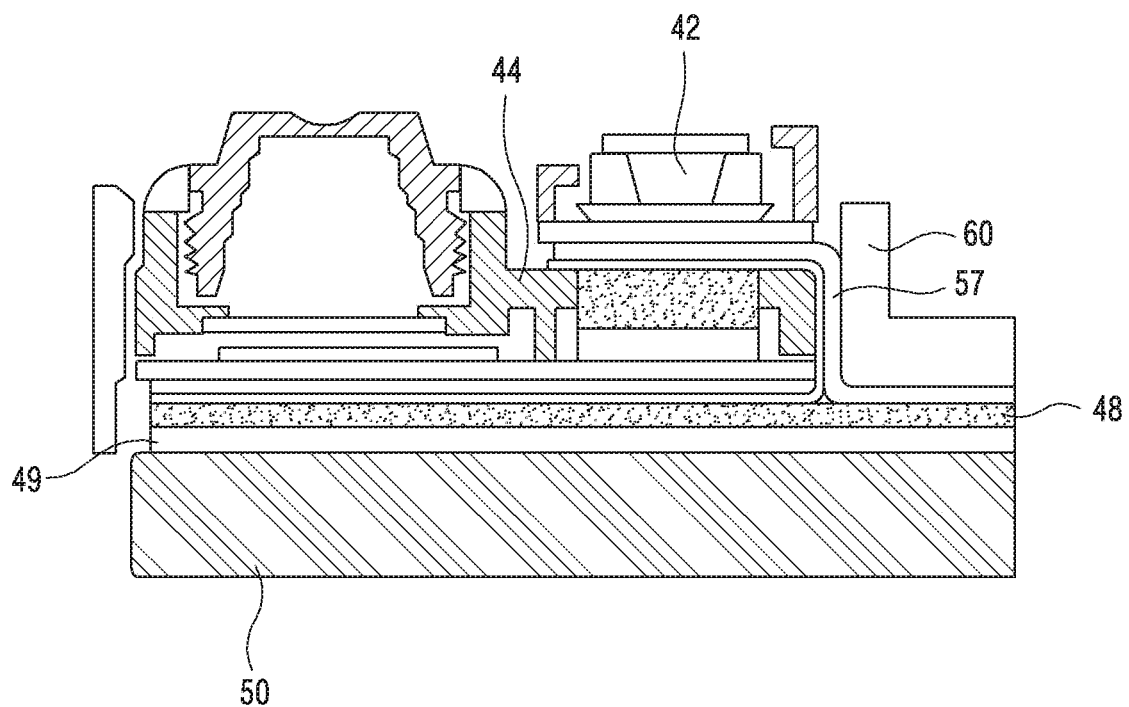
FIG. 12A is a cross-sectional view illustrating a heat dissipation structure of a camera according to an embodiment of the disclosure.
Figure 12B:
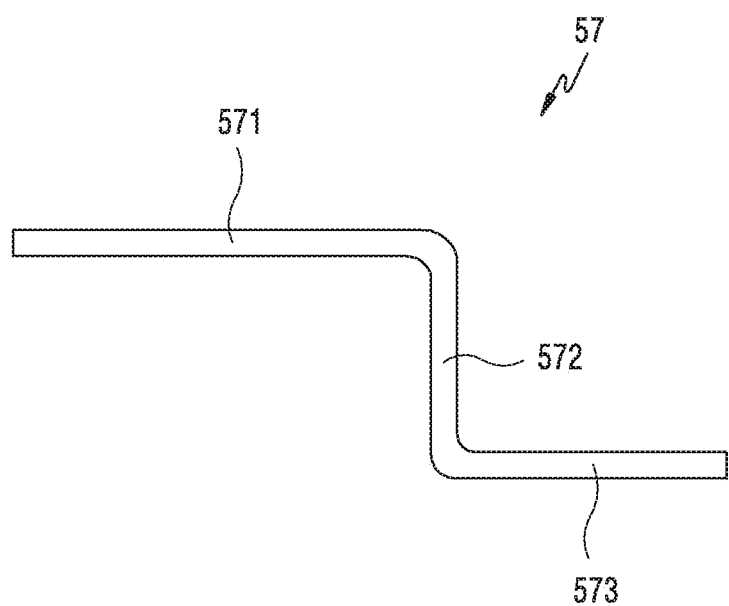
FIG. 12B is a side view illustrating a third metal plate according to an embodiment of the disclosure.
Figure 12C:
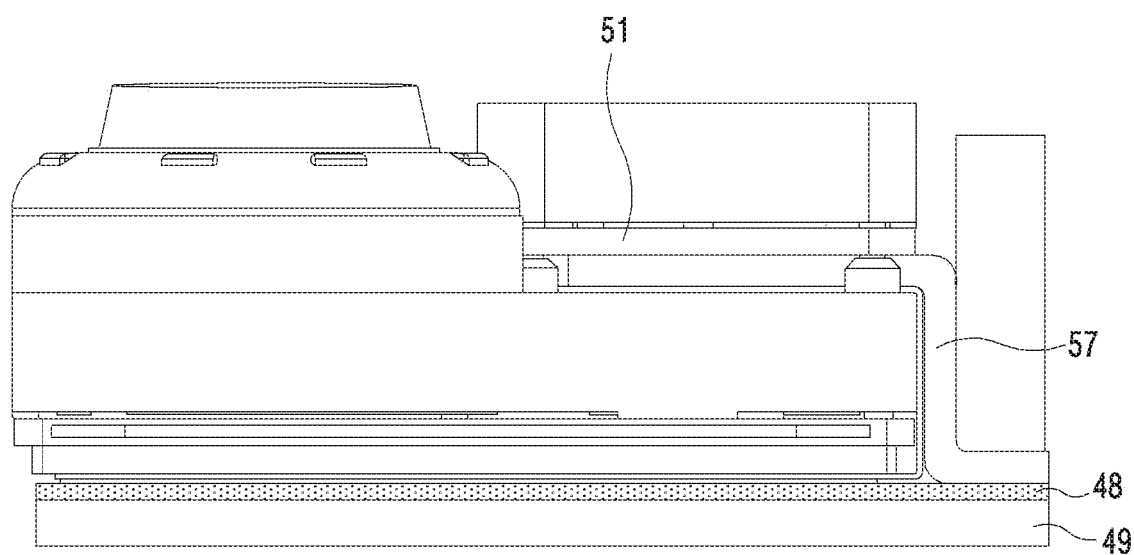
FIG. 12C is a side view illustrating a heat dissipation structure of a camera using a third metal plate according to an embodiment of the disclosure.
Figure 12D:
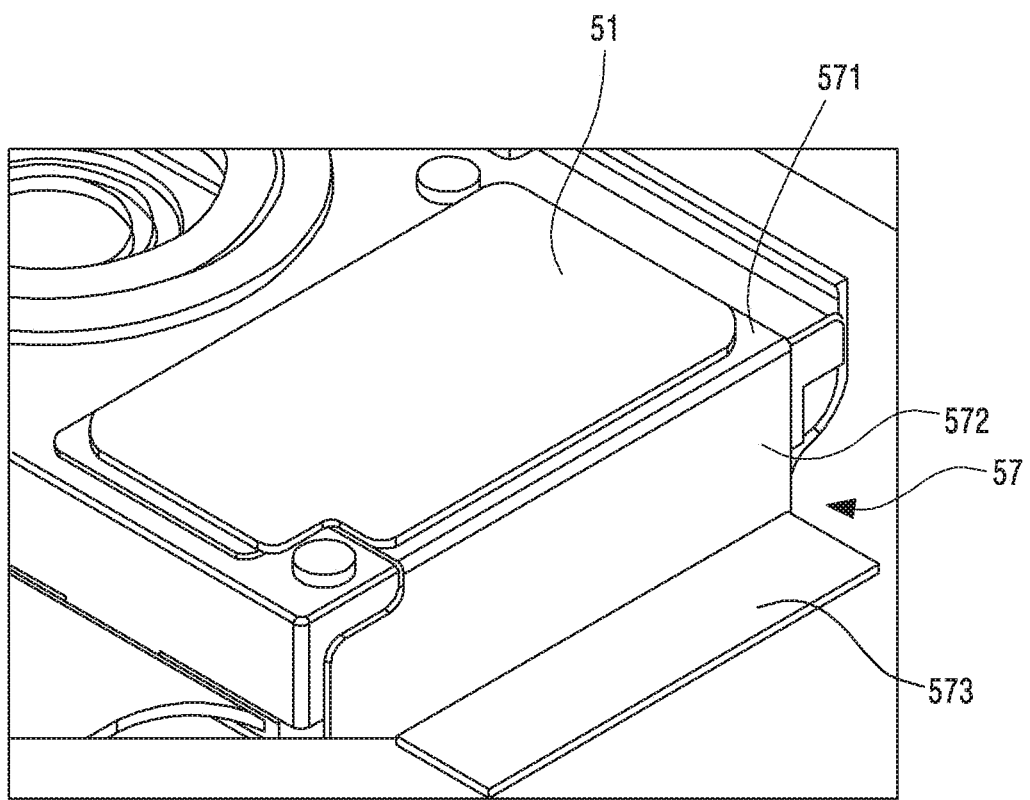
FIG. 12D is a perspective view illustrating a state of disposing a third metal plate according to an embodiment of the disclosure.

FIG. 12A is a cross-sectional view illustrating a heat dissipation structure of a camera according to an embodiment of the disclosure. FIG. 12B is a side view illustrating a third metal plate according to an embodiment of the disclosure. FIG. 12C is a side view illustrating a heat dissipation structure of a camera using a third metal plate according to an embodiment of the disclosure. FIG. 12D is a perspective view illustrating a state of disposing a third metal plate according to an embodiment of the disclosure.

Referring to FIGS. 12A to 12D, the heat dissipation structure will be described in comparison with the heat dissipation structure of the camera of FIG. 4A, and only different parts will be described while omitting descriptions on the same structure. The heat dissipation structure of the camera according to an embodiment is the same as the heat dissipation structure of FIG. 4A except for the structure of transferring heat from the laser emitter 42 to the vapor chamber 49, and thus detailed descriptions thereof will be omitted.

According to an embodiment, heat produced in the laser emitter 42 may be transferred to the vaper chamber 49 by means of a third metal plate 57. According to an embodiment, the third metal plate 57 may be bent at least one time.

According to an embodiment, part of the third metal plate 57 may include a first portion 571 to a third portion 573, as a stiffener.

According to an embodiment, the first portion 571 of the third metal plate may be disposed between the laser emitter 42 and part of the housing structure 44. According to an embodiment, the second portion may be disposed along a side face of the housing structure 44. According to an embodiment, the third portion may be disposed, for example, between the support member 60 and a TIM. Heat produced in the laser emitter 42 may be transferred to the TIM 48 by means of the first portion 571 and the third portion 573. According to an embodiment, heat reaching the third portion 573 may be spread after being transferred to each of the display bracket 50 and the vaper chamber 49. Then, heat transferred to the vaper chamber 49 may be transferred, for example, to the display bracket 50.

According to an embodiment, a second portion 572 may be bent substantially about 80 degrees from the first portion 571, and the third portion 573 may be bent substantially about 90 degrees from the second portion 572.

Figure 13:
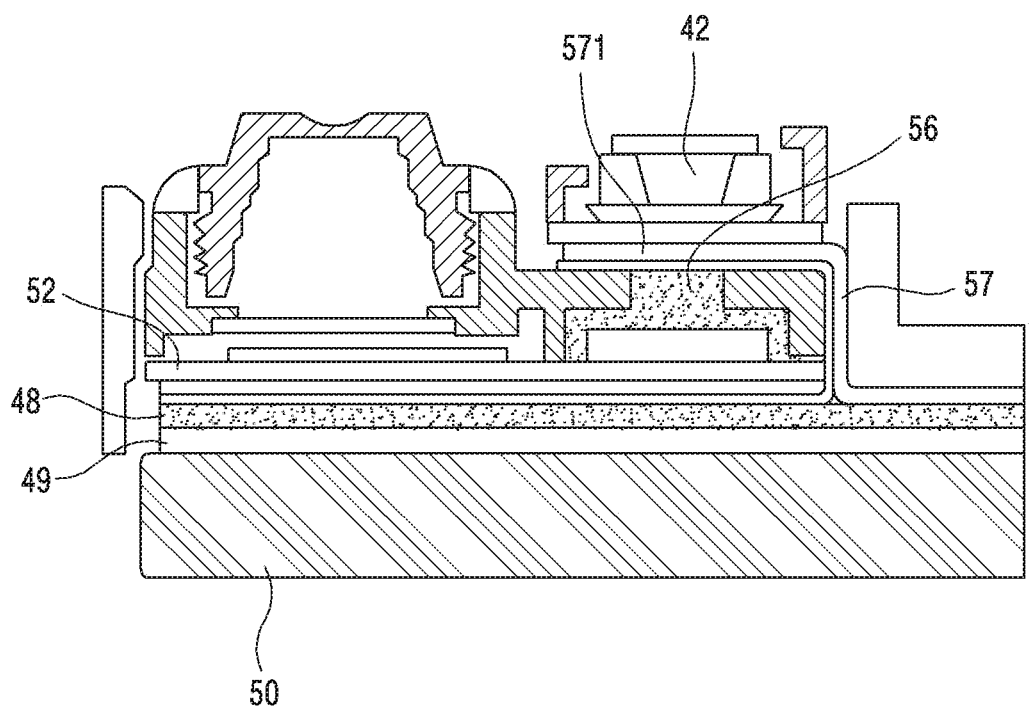
FIG. 13 is a cross-sectional view illustrating a heat dissipation structure of a camera according to an embodiment of the disclosure.

FIG. 13 is a cross-sectional view illustrating a heat dissipation structure of a camera according to an embodiment of the disclosure.

Referring to FIG. 13, the heat dissipation structure of the camera may be constructed by combining the heat transfer structure using the filling TIM of FIG. 9A and the heat transfer structure using the third metal structure of FIGS. 12A and 12B.

According to an embodiment, part of heat produced in the laser emitter 42 may be transferred to the TIM 48 by using the third metal plate 57, and the remaining parts of the heat transferred to the first portion 571 of the third metal plate may be transferred toward the laser driver 43 and the second printed circuit board 52 by means of the filling TIM 56.

Figure 14:
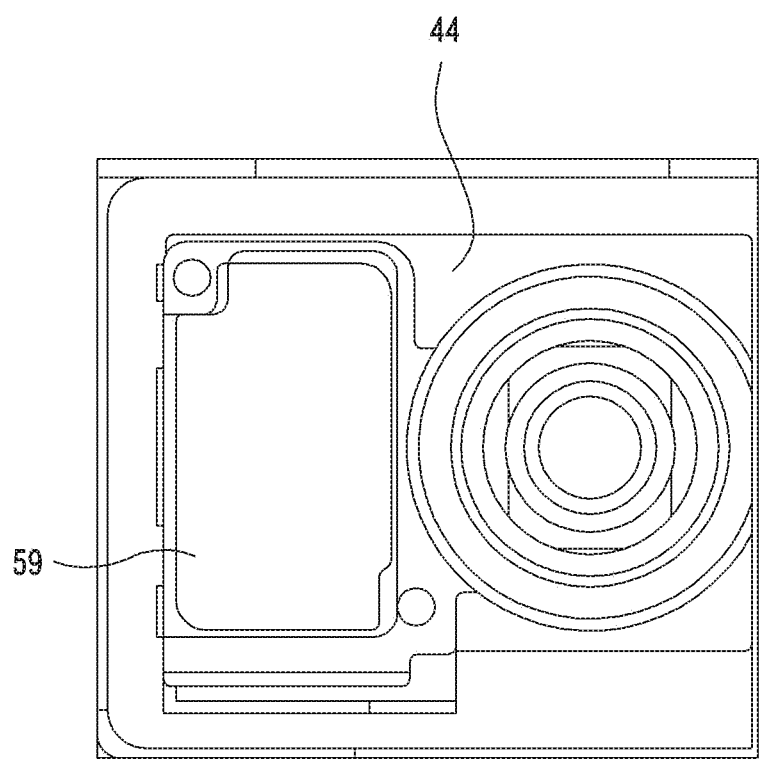
FIG. 14 is a plan view illustrating a state in which an Electro-Magnetic interference (EMI) shielding member is attached to a housing structure according to an embodiment of the disclosure.

FIG. 14 is a plan view illustrating a state in which an Electro-Magnetic interference (EMI) shielding member is attached to a housing structure according to an embodiment of the disclosure.

Referring to FIG. 14, an opening (e.g., the filling opening 442 of FIG. 8A) constructed on the housing structure 44 according to various embodiments may be closed by means of an EMI shielding member 59 attached thereto. The EMI shielding member 59 may be composed of a nano-film type tape and may be attached to the opening. For example, the opening may be a filling opening or an attaching opening. According to an embodiment, the EMI shielding member 59 may be attached to the housing structure 44 without the opening.

According to an embodiment, an electronic device (e.g., the electronic device 100 of FIG. 1 or the electronic device 300 of FIG. 3) may include: a housing (e.g., the housing 110 of FIG. 1) including a front plate (e.g., the front plate 102 of FIG. 1) facing a first direction (e.g., the first direction ① of FIG. 1) and a back plate (e.g., the back plate 111 of FIG. 2) facing a second direction (e.g., the second direction ② of FIG. 1) opposite to the first direction; an image sensor (e.g., the image sensor 41 of FIG. 4A) disposed inside the housing and disposed to receive light through a first region (e.g., the first region 111a of FIG. 2) of the back plate; a laser emitter (e.g., the laser emitter 42 of FIG. 4A) disposed inside the housing, adjacent to the image sensor, and disposed to emit light through a second region (e.g., the second region 111b of FIG. 2) of the back plate, adjacent to the first region; a laser driver (e.g., the laser driver 43 of FIG. 4A) disposed between the laser emitter and the front plate; a housing structure (e.g., the housing structure 44 of FIG. 4A) surrounding at least part of a side face of the image sensor and driver; a first metal structure (e.g., the first metal structure 450 of FIG. 4A) disposed between the laser emitter and the laser driver; a first heat transfer member (e.g., the first heat transfer member 46 of FIG. 6), as a first heat transfer member, including a first portion (e.g., the first portion 461 of FIG. 6) disposed between the first metal structure and the driver, a second portion (e.g., the second portion 462 of FIG. 6) extended from the first portion along an outer face of the housing structure, and a third portion (e.g., the third portion 463 of FIG. 6) extended from the second portion to a space between the driver and the front plate, while in contact with the first metal structure; a second heat transfer member (e.g., the second heat transfer member 47) extended from the third portion of the first heat transfer member; and a first Thermal Interface Material (TIM) (e.g., the first TIM 48 of FIG. 4A) disposed between the second heat transfer member and the front plate, while in contact with the second heat transfer member.

According to an embodiment, the second heat transfer member (e.g., the second heat transfer member 47 of FIG. 6) may include a fourth portion (e.g., the first portion 471 of FIG. 6) disposed in contact with the third portion (e.g., the third portion 463 of FIG. 6); and a fifth portion (e.g., the second portion 472 of FIG. 6) extended from the first portion and disposed in contact with the first TIM (e.g., the first TIM 48 of FIG. 4A).

According to an embodiment, a support member (e.g., the bracket 60 of FIG. 4A) may be disposed adjacent to the housing structure (e.g., the housing structure 44 of FIG. 4A), and the fifth portion (e.g., the second portion 472 of FIG. 6) of the second heat transfer member may be thermally coupled with the support member, so that the fifth portion may be disposed between the support member and the first TIM.

According to an embodiment, the electronic device may further include a second metal structure (e.g., the second metal structure 452 of FIG. 4A) disposed between the third portion and the laser driver (e.g., the laser driver 43 of FIG. 4A), while in contact with the third portion (e.g., the first heat transfer member 46) of the first heat transfer member.

According to an embodiment, the electronic device may further include a first printed circuit board (e.g., the first printed circuit board 51 of FIG. 4A) disposed between the laser emitter (e.g., the laser emitter 42 of FIG. 4A) and the first metal structure (e.g., the first metal structure 450 of FIG. 4A); and a second printed circuit board (e.g., the second printed circuit board 52 of FIG. 4A) disposed between the laser driver and the third portion (e.g., the third portion 463 of FIG. 6) and electrically coupled with the first printed circuit board. The laser emitter (e.g., the laser emitter 42 of FIG. 4A) may be placed on the first printed circuit board, and the laser driver (e.g., the laser driver 43 of FIG. 4A) may be placed on the second printed circuit board.

According to an embodiment, a first metal structure (e.g., the first metal structure 450 of FIG. 5), as a metal plate supporting the first printed circuit board (e.g., the first printed circuit board 51 of FIG. 5) may transfer heat produced in the laser emitter (e.g., the laser emitter 42 of FIG. 6) to the first portion (e.g., the first portion 461 of FIG. 6).

According to an embodiment, a second metal structure (e.g., the second metal structure 452 of FIG. 5), as a metal plate supporting the second printed circuit board (e.g., the second printed circuit board 52 of FIG. 5) may transfer heat produced in the laser driver (e.g., the laser driver 43 of FIG. 4A) to the third portion (e.g., the third portion 463 of FIG. 6).

According to an embodiment, a bracket (e.g., the support member 60 of FIG. 4A) may be disposed to a housing structure (e.g., the housing structure 44 of FIG. 4A), and at least part of the first metal structure (e.g., the first metal structure 450 of FIG. 5) may be thermally coupled with the first TIM (e.g., the first TIM 48 of FIG. 4A) by being bent at least one time.

According to an embodiment, the housing structure (e.g., the housing structure 44 of FIG. 8A) may be internally filled with a TIM (e.g., the TIM 55 of FIG. 8A) of a liquid state, and may surround the laser driver (e.g., the laser driver 43 of FIG. 8A).

According to an embodiment, heat produced in the laser emitter (e.g., the laser emitter 42 of FIG. 8A) may be transferred to the second printed circuit board (e.g., the second printed circuit board 452 of FIG. 8A) by means of the filling TIM.

According to an embodiment, an electronic device (e.g., the electronic device 100 of FIG. 1 or the electronic device 300 of FIG. 3) may include: a housing (e.g., the housing 110 of FIG. 1) including a front plate (e.g., the front plate 102 of FIG. 1) facing a first direction (e.g., the first direction ① of FIG. 4A) and a back plate (e.g., the back plate 111 of FIG. 2) facing a second direction (e.g., the second direction ② of FIG. 4A) opposite to the first direction; a first printed circuit board (e.g., the first printed circuit board 51 of FIG. 5) including a first face (e.g., the first face 51a of FIG. 5) facing the first direction and a second face (e.g., the second face 51b of FIG. 5) facing the second direction, and disposed inside the housing; a second printed circuit board (e.g., the second printed circuit board 52 of FIG. 5) including a third face (e.g., the third face 52a of FIG. 5) facing the first direction and a fourth face (e.g., the fourth face 52b of FIG. 5) facing the second direction, and disposed to be spaced apart in the first direction from the first printed circuit board; an image sensor (e.g., the image sensor 41 of FIG. 4A) disposed to the fourth face and disposed to receive light through a first region (e.g., the first region 111a of FIG. 2) of the back plate; a laser emitter (e.g., the laser emitter 42 of FIG. 4A) disposed to the second face and disposed to emit light through a second region (e.g., the second region 111b of FIG. 2) of the back plate; a laser driver (e.g., the laser driver 43 of FIG. 4A) adjacent to the image sensor and disposed on the fourth face; a housing structure (e.g., the housing structure 44 of FIG. 4A) surrounding at least part of a side face of the image sensor and laser driver; a first heat transfer member (e.g., the first heat transfer member 46 of FIG. 6) including a first portion (e.g., the first portion 461 of FIG. 6) thermally coupled with the first printed circuit board and disposed between the first printed circuit board and the driver, a second portion (e.g., the second portion 462 of FIG. 6) extended along an outer face of the housing structure from the first portion, and a third portion (e.g., the third portion 463 of FIG. 6) extended from the second portion to a space between the second printed circuit board and the back plate; and a Thermal Interface Material (TIM) (e.g., the first TIM 48 of FIG. 4A) thermally coupled with part of the first heat transfer member and disposed between a third portion of the first heat transfer member and the front plate.

According to an embodiment, the first heat transfer member (e.g., the first heat transfer member 46 of FIG. 6) may be thermally coupled with the first TIM (e.g., the first TIM 48 of FIG. 4A) by means of a second heat transfer member (e.g., the second heat transfer member 47 of FIG. 6).

According to an embodiment, each of the first heat transfer member (e.g., the first heat transfer member 46 of FIG. 6) and the second heat transfer member (e.g., the second heat transfer member 47 of FIG. 6) may include a graphite sheet.

According to an embodiment, the first printed circuit board (e.g., the first printed circuit board 51 of FIG. 5) may be supported by attaching a first metal plate (e.g., the first metal structure 450 of FIG. 5) to the first face (e.g., the first face 51*a* of FIG. 5), and heat transferred from the laser emitter (e.g., the laser emitter 42 of FIG. 4A) may be transferred to the first portion (e.g., the first portion 461 of FIG. 6) by means of the first metal plate.

According to an embodiment, the second printed circuit board (e.g., the second printed circuit board 52 of FIG. 5) may be supported by attaching a second metal plate (e.g., the second metal structure 452 of FIG. 5) to the third face (e.g., the third face 52*a* of FIG. 5), and heat transferred from the laser driver (e.g., the laser driver 43 of FIG. 4A) is transferred to the third portion (e.g., the third portion 463 of FIG. 6) by means of the second metal plate.

According to an embodiment, the first TIM (e.g., the first TIM 48 of FIG. 4A) may be thermally coupled with a vapor chamber (e.g., the vapor chamber 49 of FIG. 4A).

According to an embodiment, the vapor chamber (e.g., the vapor chamber 49 of FIG. 4A) may be thermally coupled with a display bracket (e.g., the bracket 50 of FIG. 4A).

According to an embodiment, in the housing structure (e.g., the housing structure 44 of FIG. 4A), a support member (e.g., the bracket 60 of FIG. 4A) may be disposed to be adjacent, and part of the second thermal transfer member (e.g., the second heat transfer member 47 of FIG. 4A) may be thermally coupled with the support member.

According to an embodiment, the electronic device (e.g., the electronic device 100 of FIG. 1) may include a 5G antenna, and the 5G antenna may be disposed adjacent to the laser emitter (e.g., the laser emitter 42 of FIG. 4A).

According to an embodiment, the housing structure (e.g., the housing structure 44 of FIG. 4A) may be composed of a polymer material or a metal material or a combination of the polymer and metal materials.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing including:
a front plate facing a first direction, and
a back plate facing a second direction opposite to the first direction;
an image sensor to receive light through a first region of the back plate, the image sensor disposed inside the housing;
a laser emitter to emit light through a second region of the back plate, adjacent to the first region, the laser emitter disposed inside the housing, adjacent to the image sensor;
a laser driver disposed between the laser emitter and the front plate;
a housing structure surrounding at least a part of a side face of the image sensor and driver;
a first metal structure disposed between the laser emitter and the laser driver;
a first heat transfer member including:
a first portion disposed between the first metal structure and the driver,
a second portion extended from the first portion along an outer face of the housing structure, and
a third portion extended from the second portion to a space between the driver and the front plate, while in contact with the first metal structure;
a second heat transfer member extended from the third portion of the first heat transfer member; and
a first Thermal Interface Material (TIM) disposed between the second heat transfer member and the front plate, the first TIM being in contact with the second heat transfer member.

2. The electronic device of claim 1, wherein the second heat transfer member includes:
a fourth portion being in contact with the third portion; and
a fifth portion extended from the first portion and being in contact with the first TIM.

3. The electronic device of claim 2,
wherein a support member is disposed adjacent to the housing structure, and
wherein the fifth portion of the second heat transfer member is thermally coupled with the support member, such that the fifth portion is disposed between the support member and the first TIM.

4. The electronic device of claim 1, further comprising:
a second metal structure disposed between the third portion and the laser driver,
wherein the second metal structure is in contact with the third portion of the first heat transfer member.

5. The electronic device of claim 4, further comprising:
a first printed circuit board disposed between the laser emitter and the first metal structure; and
a second printed circuit board disposed between the laser driver and the third portion, the second printed circuit board being electrically coupled with the first printed circuit board,
wherein the laser emitter is placed on the first printed circuit board, and
wherein the laser driver is placed on the second printed circuit board.

6. The electronic device of claim 5,
wherein the first metal structure comprises a metal plate supporting the first printed circuit board, and
wherein the first metal structure transfers heat produced in the laser emitter to the first portion.

7. The electronic device of claim 5,
wherein the second metal structure comprises a metal plate supporting the second printed circuit board, and
wherein the second metal structure transfers heat produced in the laser driver to the third portion.

8. The electronic device of claim 1,
wherein a bracket is disposed adjacent to the housing structure, and
wherein at least a part of the first metal structure is thermally coupled with the first TIM by being bent at least once.

9. The electronic device of claim 1, wherein the housing structure is internally filled with a TIM in a liquid state, and surrounds the laser driver.

10. The electronic device of claim 9, further comprising:
one or more printed circuit boards,
wherein heat produced in the laser emitter is transferred to the one or more printed circuit boards by the TIM.

11. An electronic device comprising:
a housing including:
   a front plate facing a first direction, and
   a back plate facing a second direction opposite to the first direction;
a first printed circuit board including:
   a first face facing the first direction, and
   a second face facing the second direction, the first printed circuit board being disposed inside the housing;
a second printed circuit board including:
   a third face facing the first direction, and
   a fourth face facing the second direction, and disposed to be spaced apart in the first direction from the first printed circuit board;
an image sensor to receive light through a first region of the back plate, the image sensor disposed at the fourth face;
a laser emitter to emit light through a second region of the back plate, the laser emitter disposed at the second face;
a laser driver adjacent to the image sensor and disposed at the fourth face;
a housing structure surrounding at least part of a side face of the image sensor and laser driver;
a first heat transfer member including:
   a first portion thermally coupled with the first printed circuit board and disposed between the first printed circuit board and the laser driver,
   a second portion extended along an outer face of the housing structure from the first portion, and
   a third portion extended from the second portion to a space between the second printed circuit board and the back plate; and
a first Thermal Interface Material (TIM) thermally coupled with a part of the first heat transfer member and disposed between a third portion of the first heat transfer member and the front plate.

12. The electronic device of claim 11, wherein the first heat transfer member is thermally coupled with the first TIM by a second heat transfer member.

13. The electronic device of claim 12, wherein each of the first heat transfer member and the second heat transfer member includes a graphite sheet.

14. The electronic device of claim 11,
wherein the first printed circuit board is supported by attaching a first metal plate to the first face, and
wherein heat transferred from the laser emitter is transferred to the first portion by the first metal plate.

15. The electronic device of claim 14,
wherein the second printed circuit board is supported by attaching a second metal plate to the third face, and
wherein heat transferred from the laser driver is transferred to the third portion by the second metal plate.

16. The electronic device of claim 11, further comprising:
a vapor chamber,
wherein the first TIM is thermally coupled with the vapor chamber.

17. The electronic device of claim 11, further comprising:
a vapor chamber; and
a display bracket,
wherein the vapor chamber is thermally coupled with the display bracket.

18. The electronic device of claim 12, further comprising:
a support member disposed to be adjacent to at least one of the first heat transfer member or the second heat transfer member; and
a second TIM,
wherein a part of the second TIM is thermally coupled with the support member.

19. The electronic device of claim 11, further comprising:
a 5G antenna,
wherein the 5G antenna is disposed adjacent to the laser emitter.

20. The electronic device of claim 11, wherein the housing structure is composed of a polymer material or a metal material, or a combination of the polymer material and the metal material.

* * * * *